(12) United States Patent
Perng et al.

(10) Patent No.: US 6,365,452 B1
(45) Date of Patent: *Apr. 2, 2002

(54) DRAM CELL HAVING A VERTICAL TRANSISTOR AND A CAPACITOR FORMED ON THE SIDEWALLS OF A TRENCH ISOLATION

(75) Inventors: Dung-Ching Perng, San Jose; Yauh-Ching Liu, Sunnyvale, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/724,608

(22) Filed: Nov. 28, 2000

Related U.S. Application Data

(60) Division of application No. 09/083,373, filed on May 21, 1998, now Pat. No. 6,177,699, which is a continuation-in-part of application No. 09/045,633, filed on Mar. 19, 1998, now Pat. No. 6,090,661.

(51) Int. Cl.$^7$ .......................................... H01L 21/8242
(52) U.S. Cl. ...................... 438/241; 257/301; 257/302; 438/243; 438/244; 438/386; 438/387
(58) Field of Search ................................ 257/301, 303; 438/239, 241, 243, 244, 246, 248, 249, 386, 391, 392

(56) References Cited

U.S. PATENT DOCUMENTS

| | | | |
|---|---|---|---|
| 4,353,086 A | 10/1982 | Jaccodine et al. | 257/301 |
| 4,816,884 A | 3/1989 | Hwang et al. | 257/302 |
| 4,914,740 A | 4/1990 | Kenney | 257/300 |
| 4,916,511 A | 4/1990 | Douglas | 257/301 |
| 4,922,313 A | 5/1990 | Tsuchiya | 257/301 |
| 4,999,689 A | 3/1991 | Iguchi et al. | 257/303 |
| 5,026,658 A | 6/1991 | Fuse et al. | 438/248 |
| 5,041,887 A | 8/1991 | Kumangai et al. | 257/303 |
| 5,049,959 A | 9/1991 | Satoh | 257/301 |
| 5,064,777 A | 11/1991 | Dhong et al. | 438/242 |
| 5,075,248 A | 12/1991 | Yoon et al. | 438/244 |
| 5,112,771 A | 5/1992 | Ishii et al. | 438/389 |
| 5,200,354 A | 4/1993 | Om et al. | 438/243 |
| 5,214,603 A | 5/1993 | Dhong et al. | 365/207 |

(List continued on next page.)

OTHER PUBLICATIONS

H. Hada et al., "A Self–Aligned Contact Technology Using Anisotropical Selective Epitaxial Silicon for Giga–Bit DRAMs," IEDM, 1995, pp. 665–668.

*Primary Examiner*—Vu A. Le
*Assistant Examiner*—Christian D. Wilson
(74) *Attorney, Agent, or Firm*—Beyer Weaver & Thomas, L.L.P

(57) ABSTRACT

A DRAM cell capacitor and access transistor are described. Capacitor formation, access transistor fabrication and cell isolation methods are integrated by using isolation trench sidewalls to form DRAM capacitors and access transistors. A doped silicon substrate adjacent to the vertical sidewalls of the isolation trench provides one DRAM cell capacitor plate. The DRAM capacitor also contains a dielectric material that partially covers the interior vertical sidewalls of the isolation trench. A conductive layer covering the dielectric material on the vertical sidewalls of the isolation trench forms the second capacitor plate and completes the DRAM capacitor. A vertically oriented access transistor is formed over top of the capacitor. To accomplish this, an isolation dielectric is deposited and patterned to provide a support structure for gate electrodes of the vertical access transistor above the trench sidewall capacitors. After gate structure formation the support layer is replaced with selectively doped epitaxial silicon in which the transistor's channel, source, and drain are formed.

21 Claims, 15 Drawing Sheets

U.S. PATENT DOCUMENTS

| | | | |
|---|---|---|---|
| 5,273,928 A | 12/1993 | Tani | 438/386 |
| 5,302,541 A * | 4/1994 | Akazawa | 438/152 |
| 5,315,543 A | 5/1994 | Matsuo et al. | 365/149 |
| 5,395,786 A | 3/1995 | Hsu et al. | 438/248 |
| 5,442,211 A | 8/1995 | Kita | 257/301 |
| 5,585,285 A | 12/1996 | Tang | 438/152 |
| 5,618,745 A | 4/1997 | Kita | 438/164 |
| 5,618,751 A | 4/1997 | Golden et al. | 438/392 |
| 5,701,022 A | 12/1997 | Kellner et al. | 257/300 |
| 5,744,386 A * | 4/1998 | Kenney | 438/245 |
| 5,844,266 A | 12/1998 | Stengl et al. | 257/301 |
| 5,990,511 A | 11/1999 | Leas | 257/301 |
| 5,998,822 A | 12/1999 | Wada | 257/301 |
| 6,060,738 A | 5/2000 | Hidaka et al. | 257/306 |
| 6,090,661 A | 7/2000 | Perng et al. | 438/248 |
| 6,200,851 B1 * | 3/2001 | Arnold | 438/243 |
| 6,242,310 B1 * | 6/2001 | Kivakaruni et al. | 438/268 |

* cited by examiner

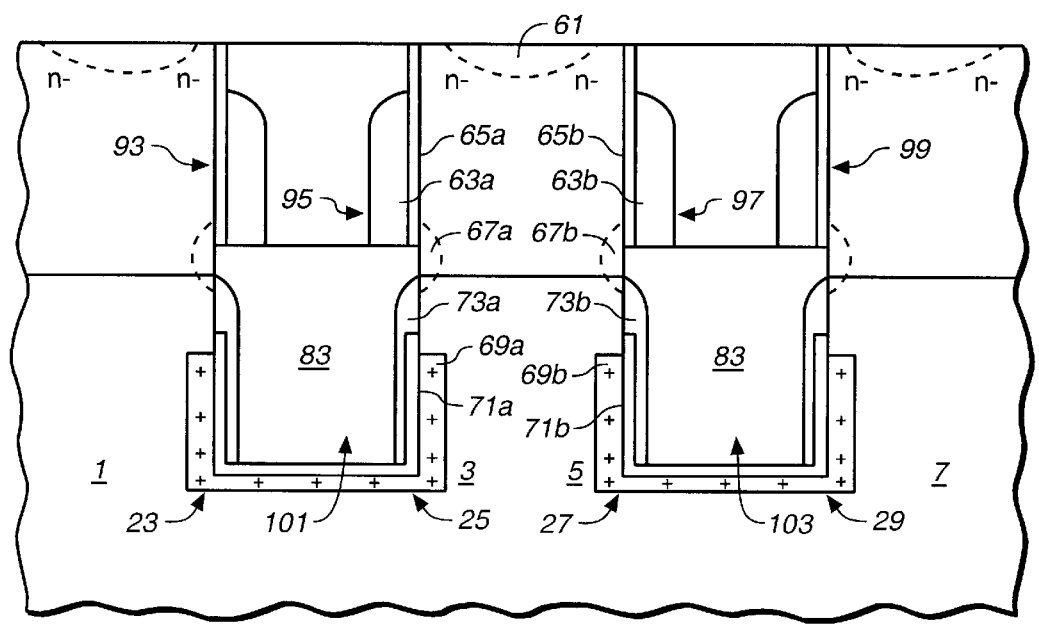
FIG._1A
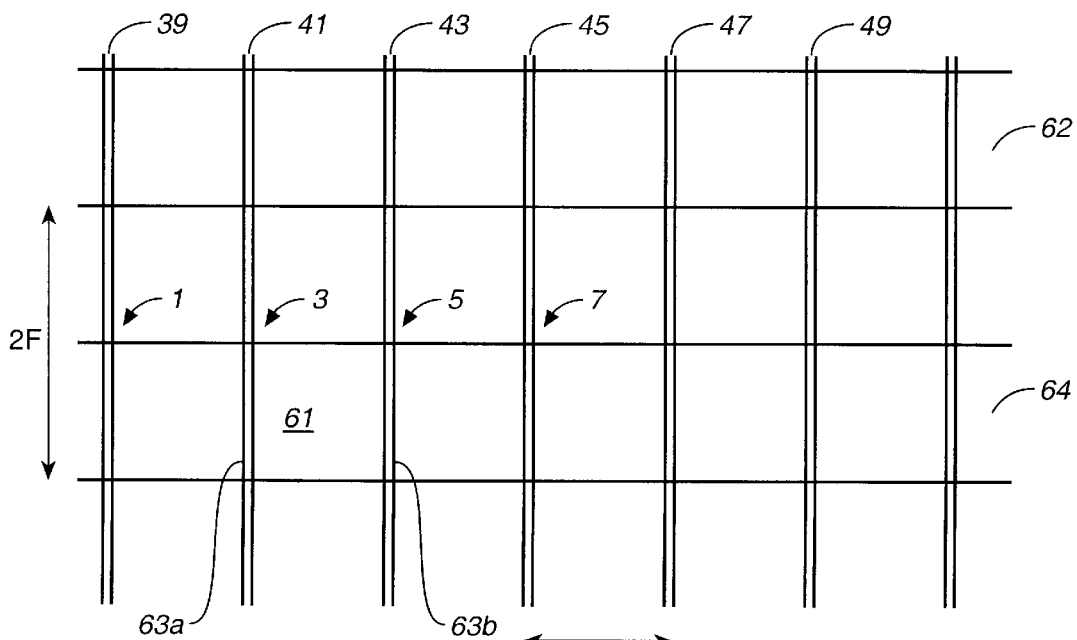
FIG._1B

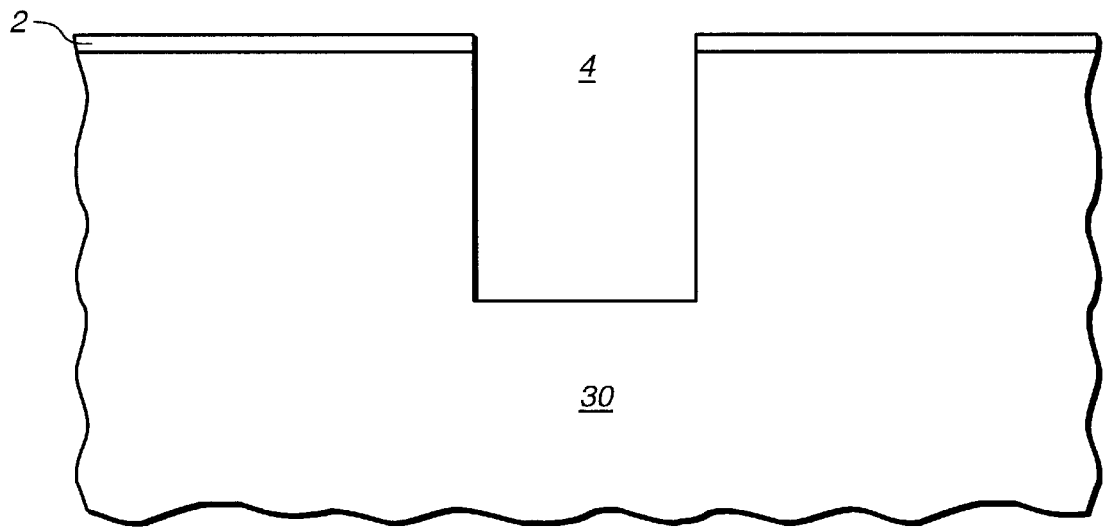
FIG._2
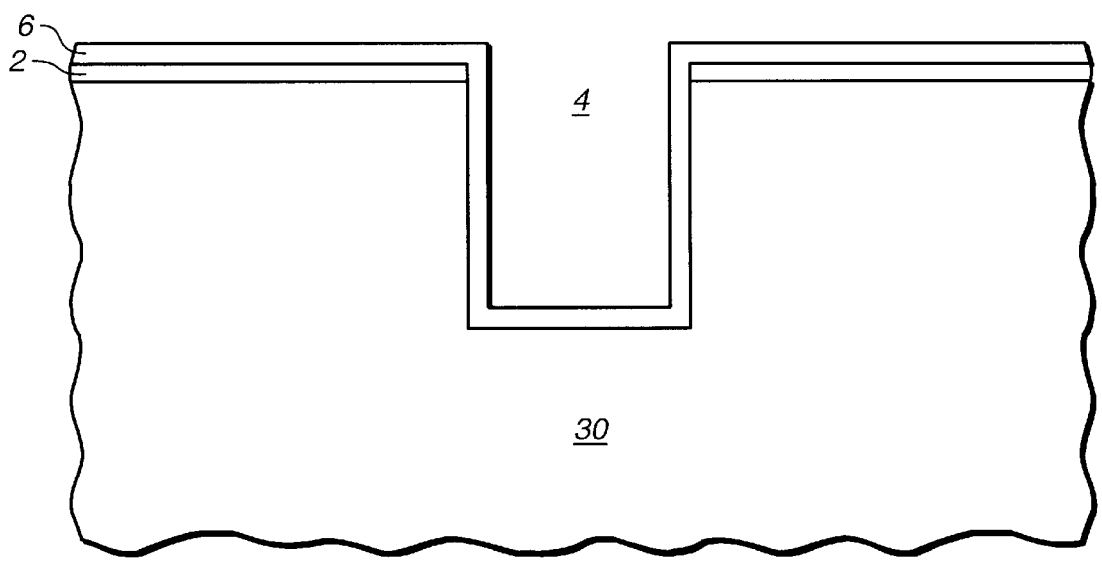
FIG._3

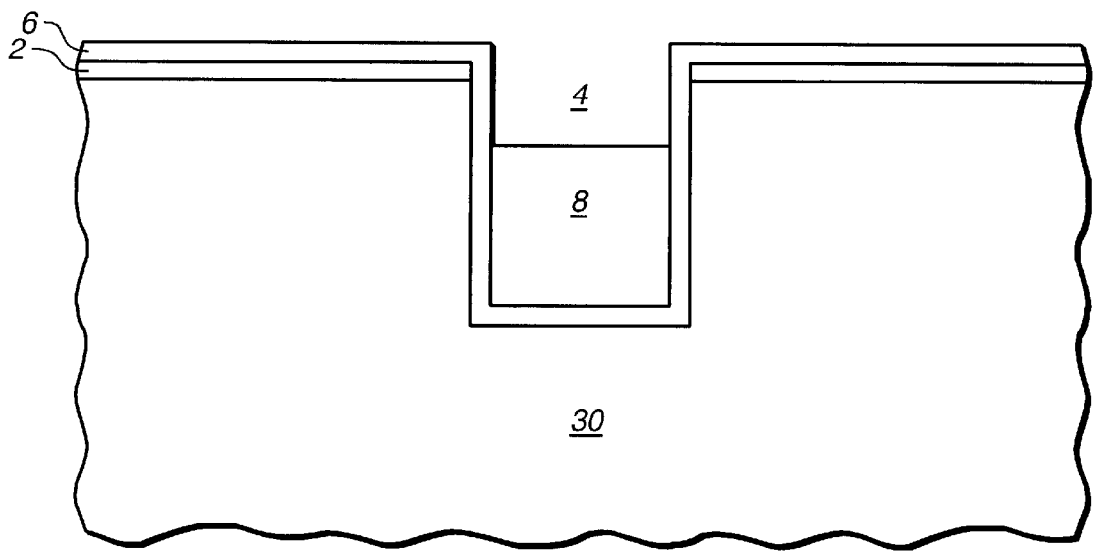
FIG._4
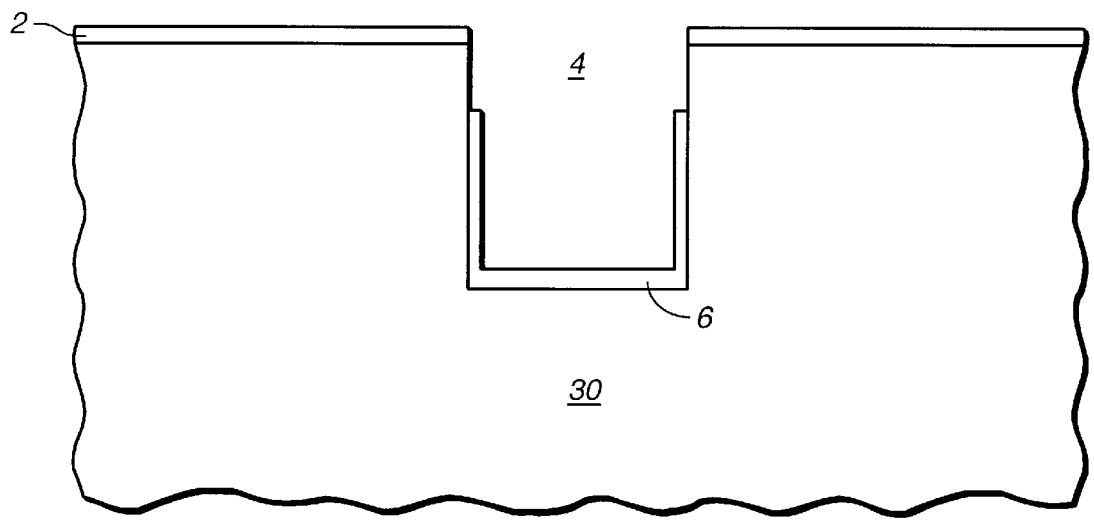
FIG._5

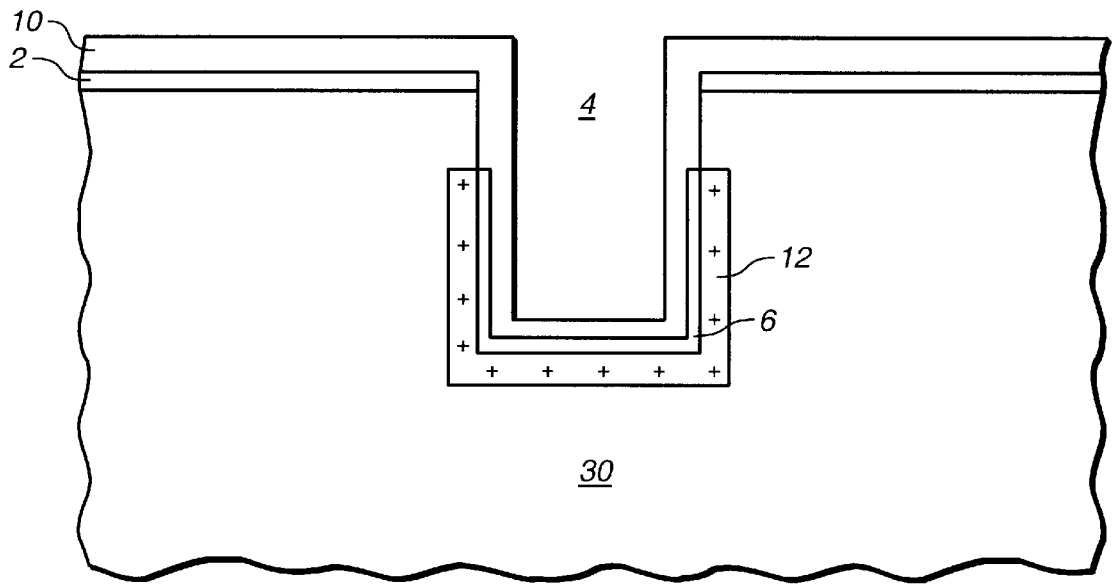
FIG._6
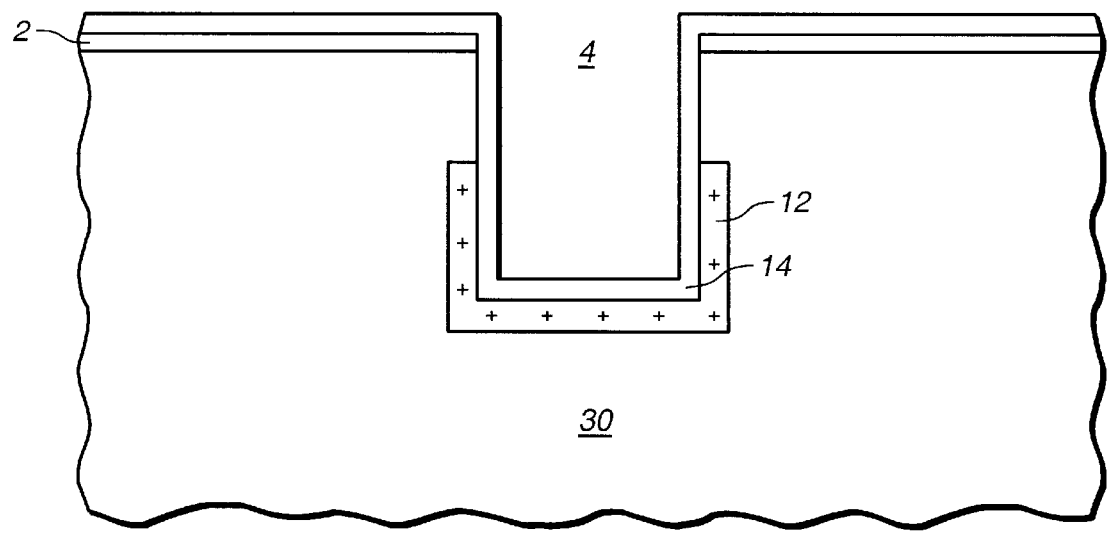
FIG._7

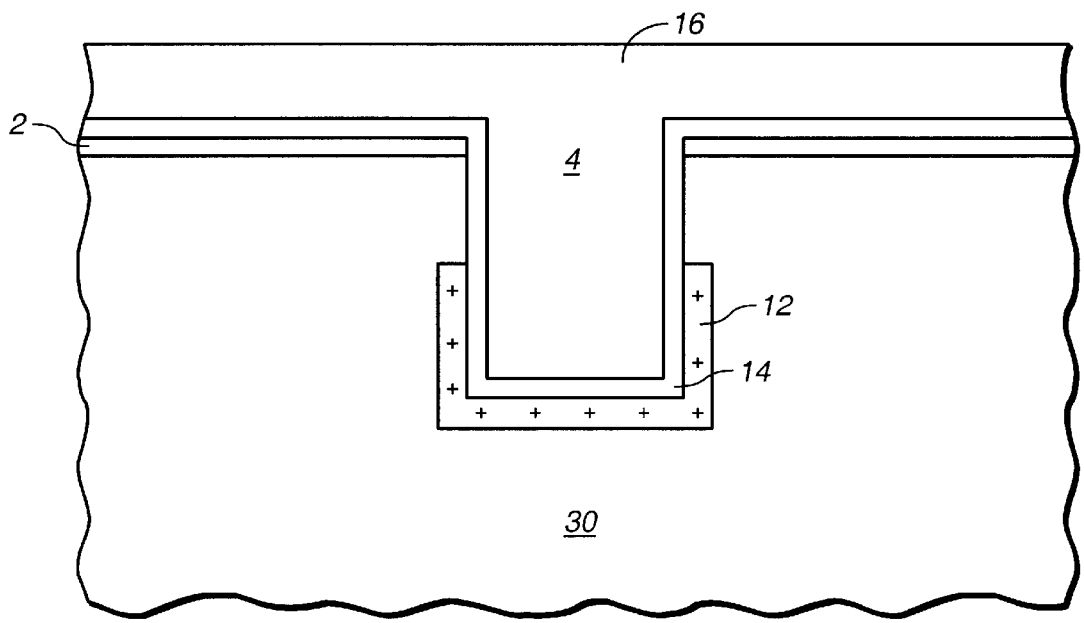
FIG._8
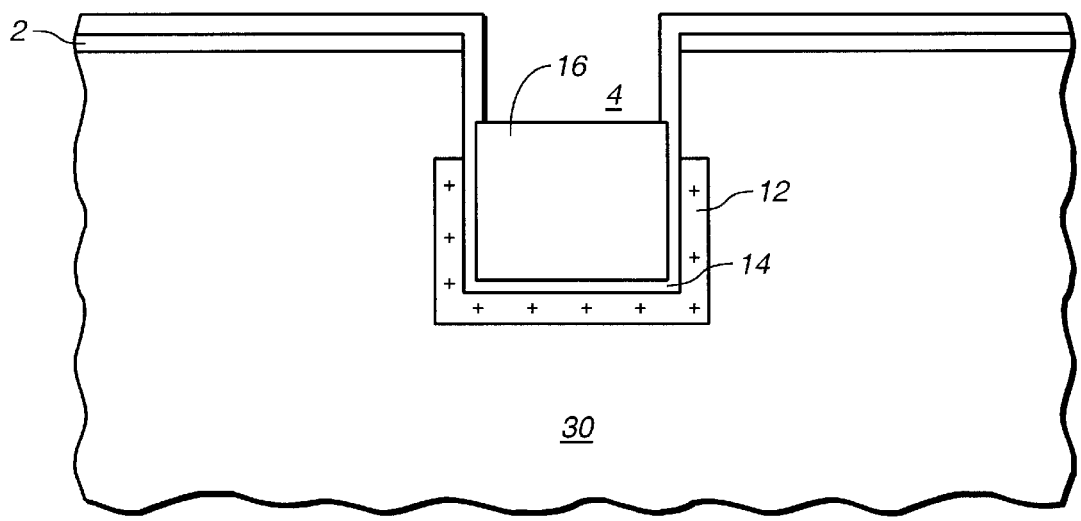
FIG._9

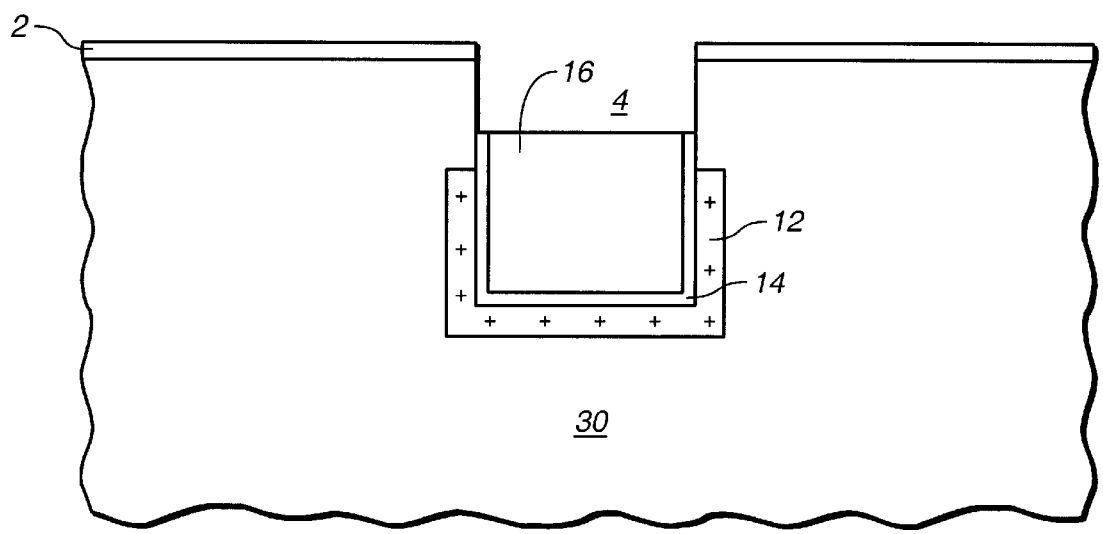
FIG._10
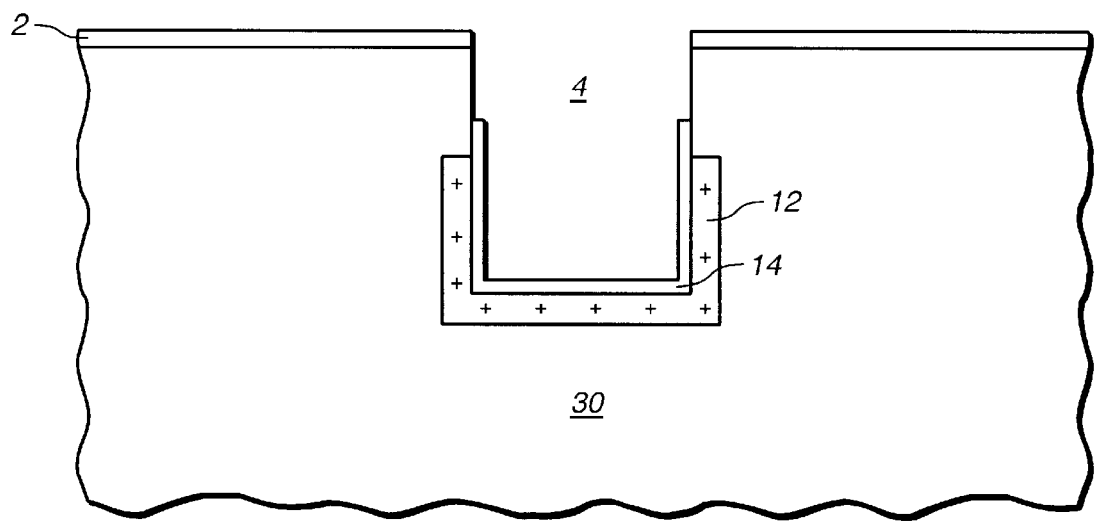
FIG._11

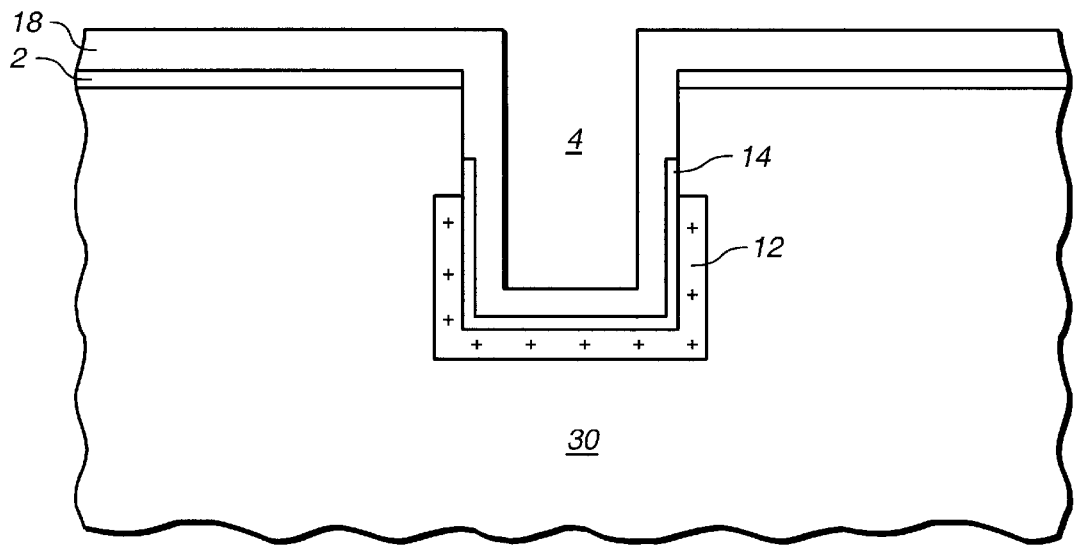
FIG._12
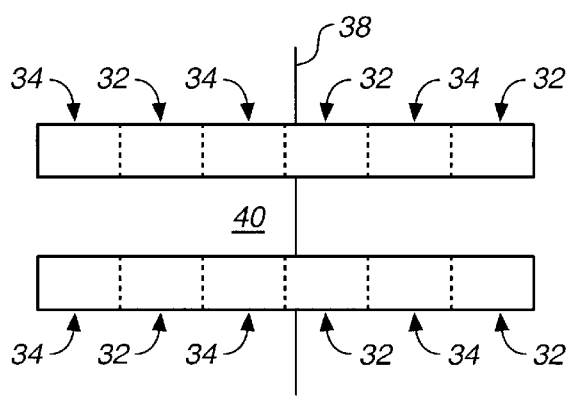
FIG._13A
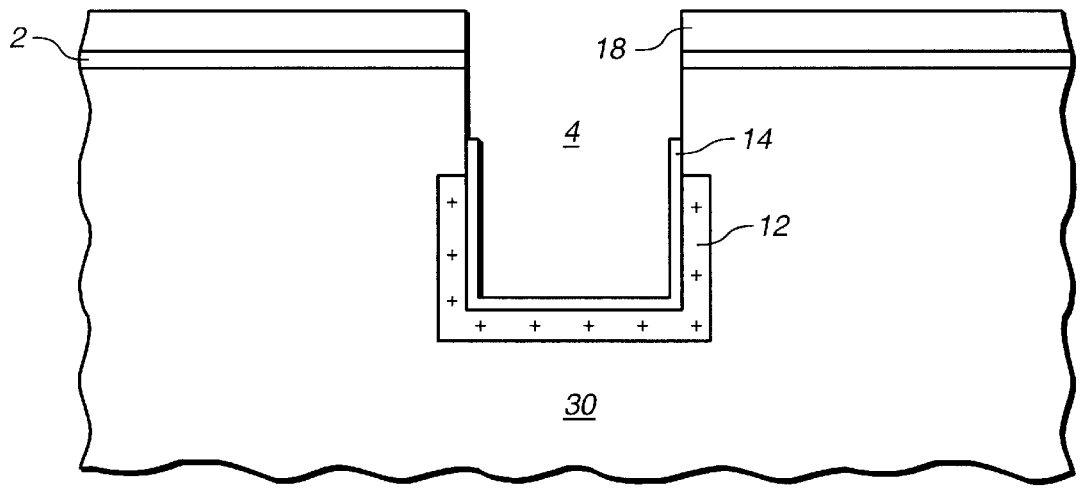
FIG._13B

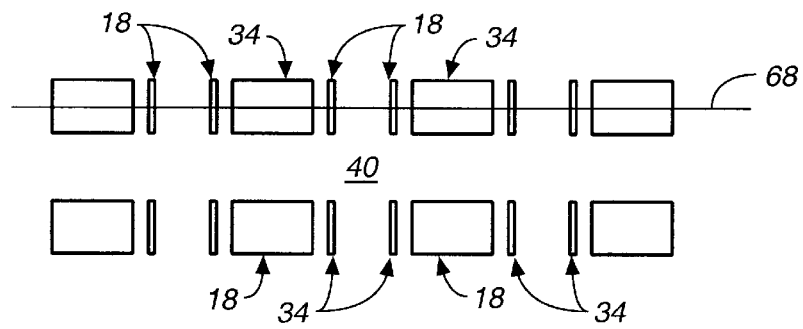
FIG._14A
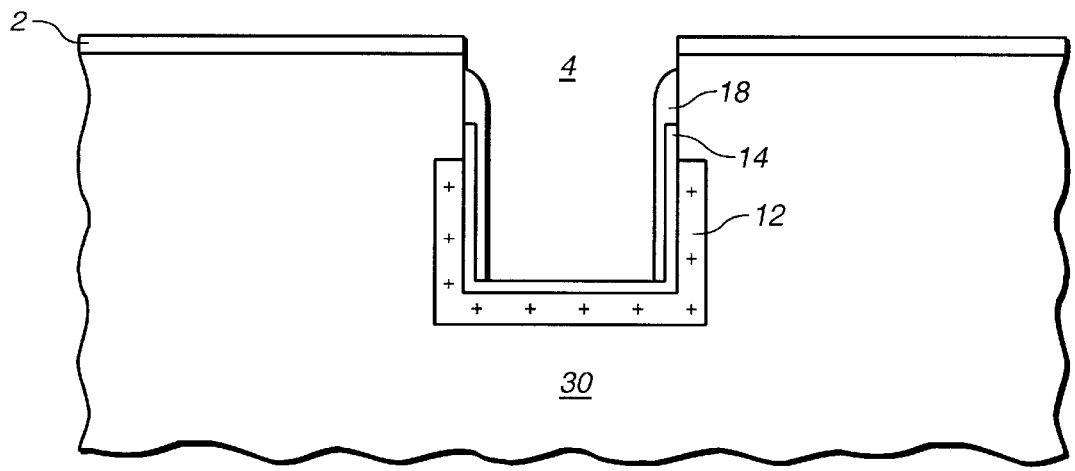
FIG._14B
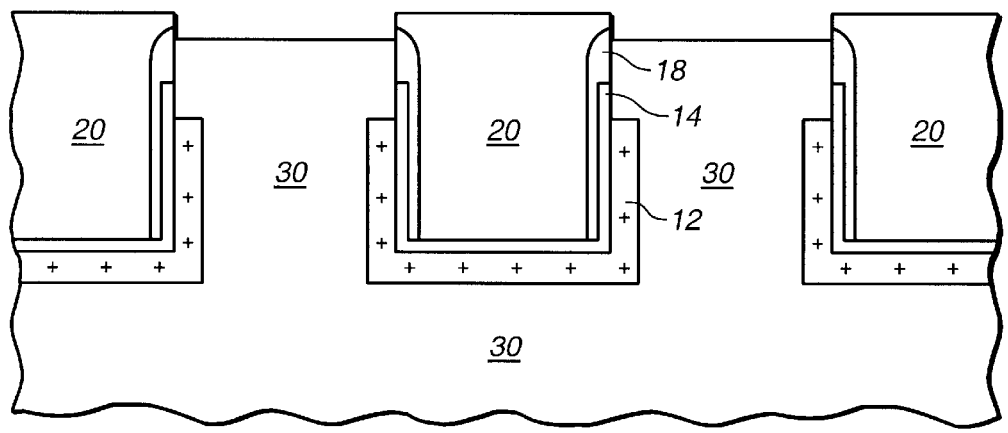
FIG._15

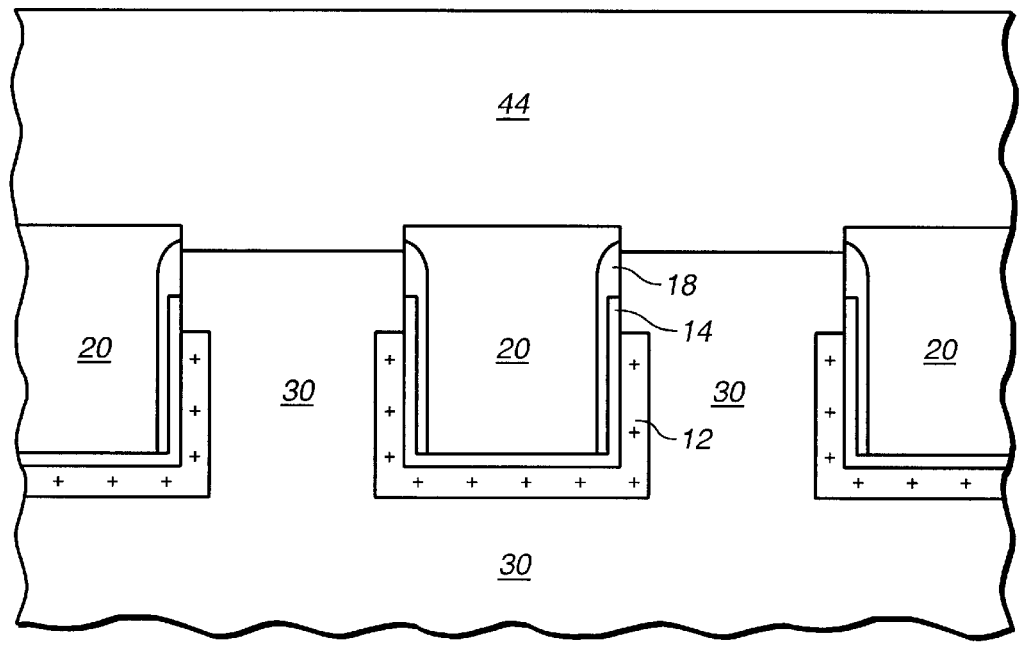
FIG._16
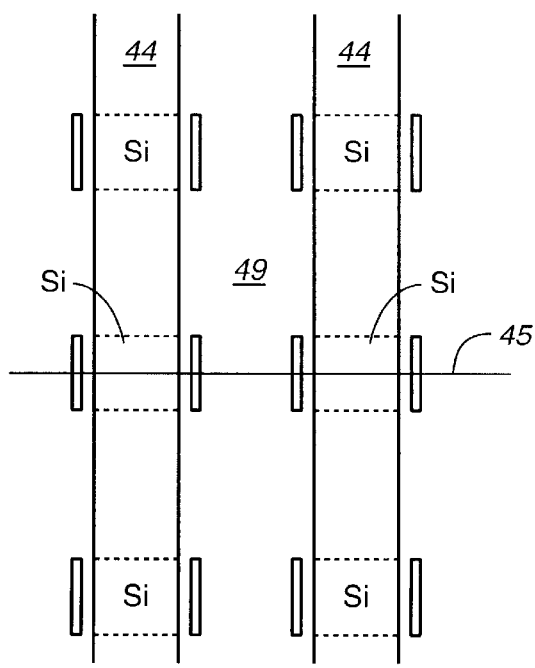
FIG._17A

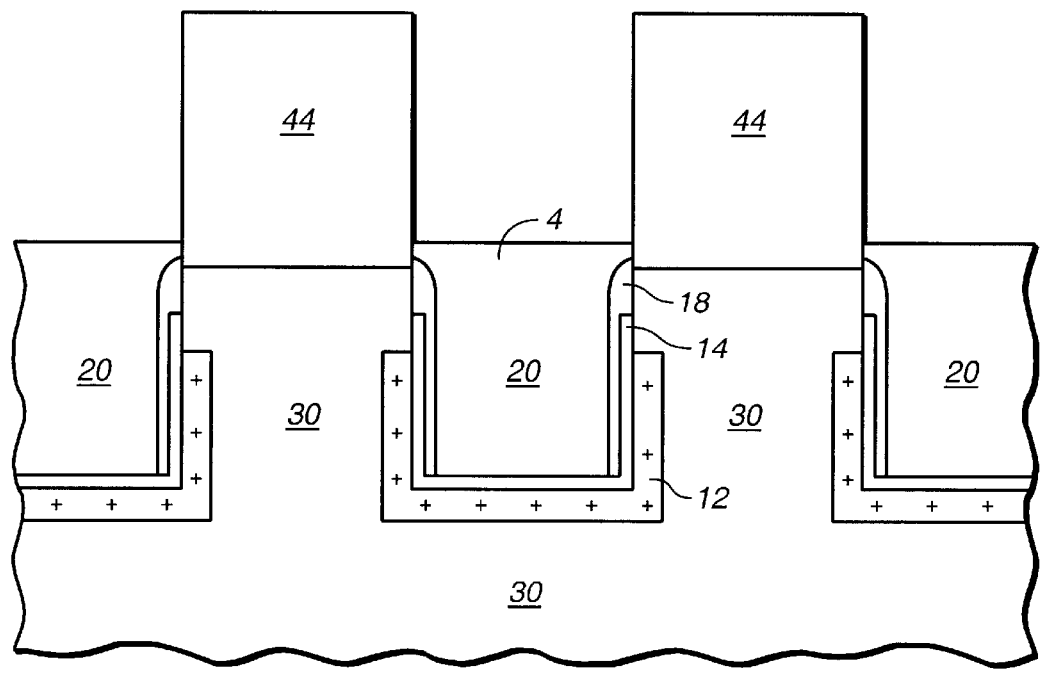
FIG._17B
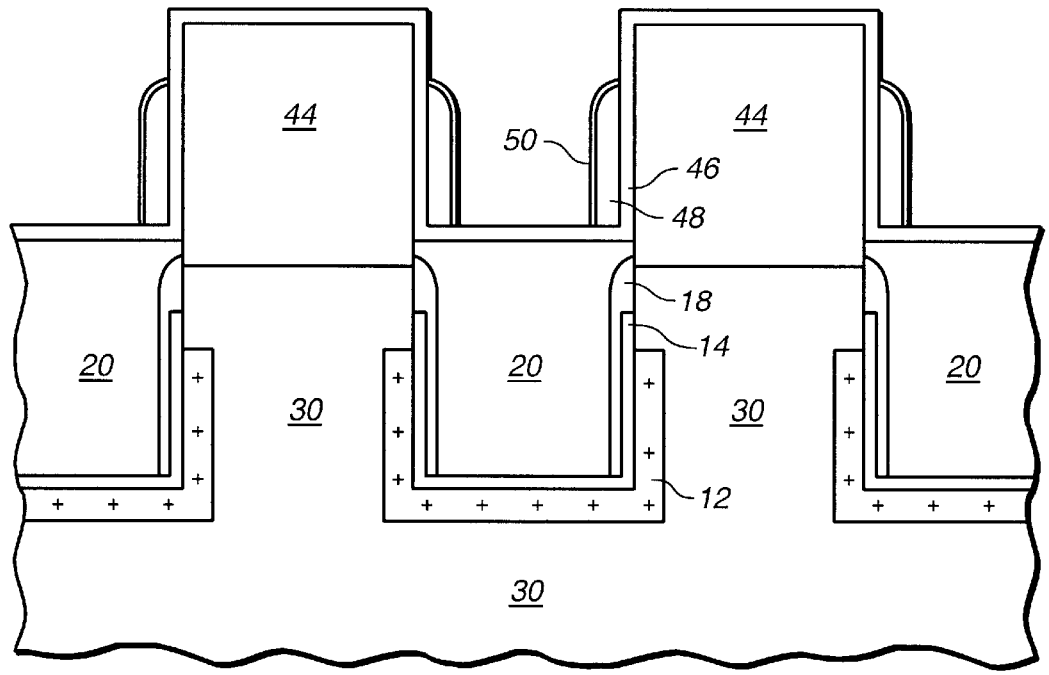
FIG._18

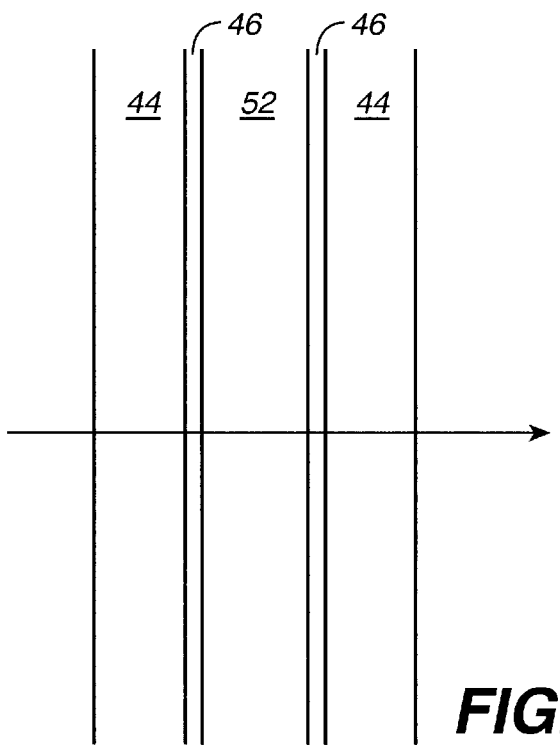
FIG._19A
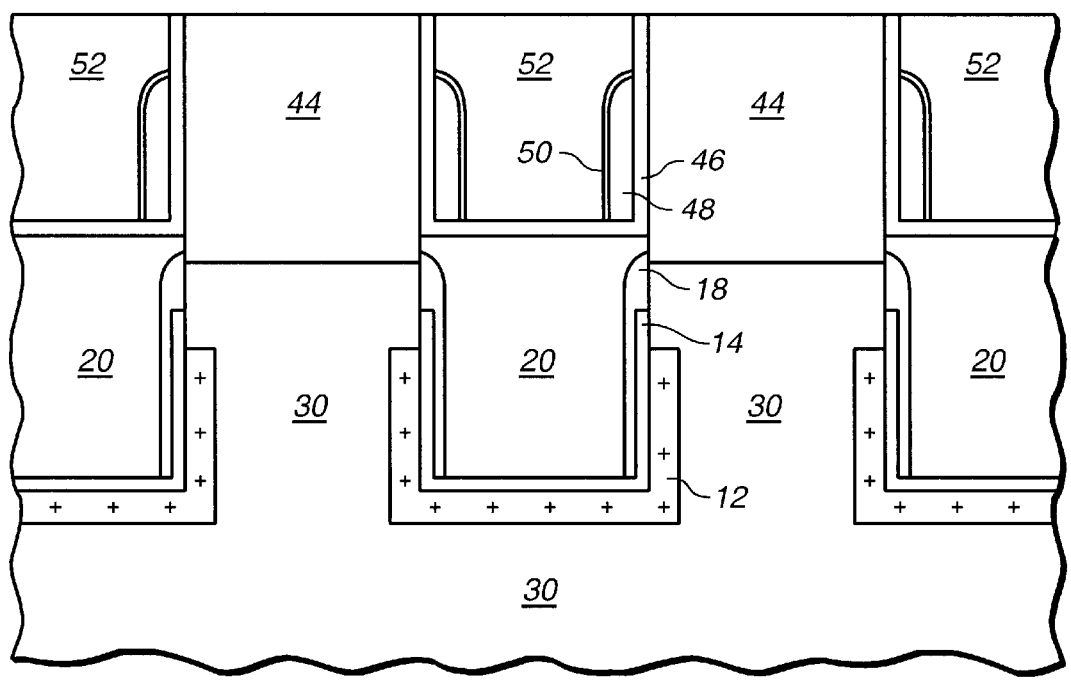
FIG._19B

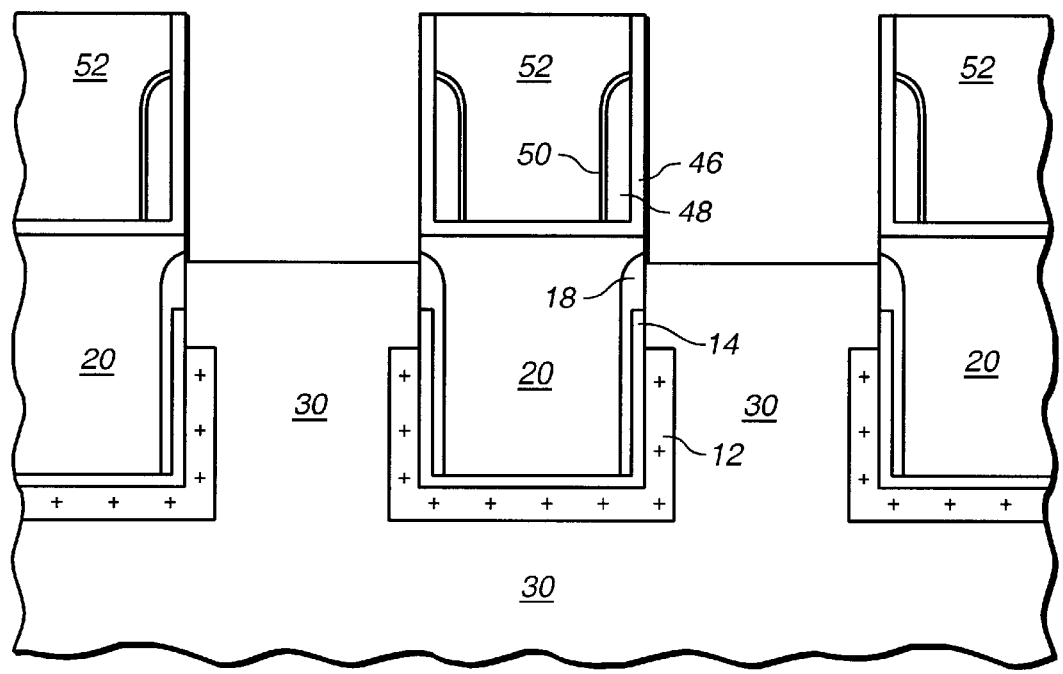
FIG._20
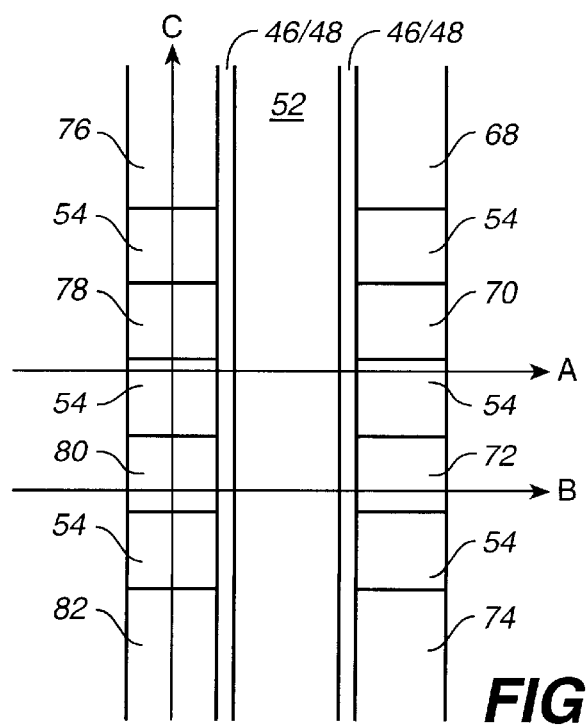
FIG._21A

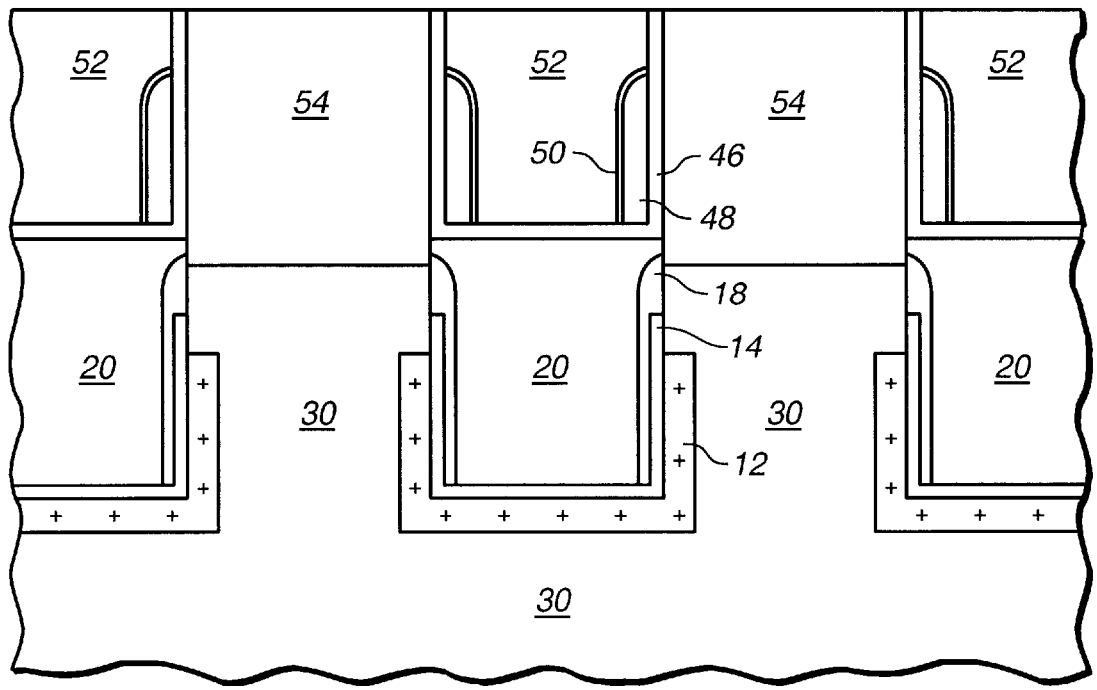
FIG._21B
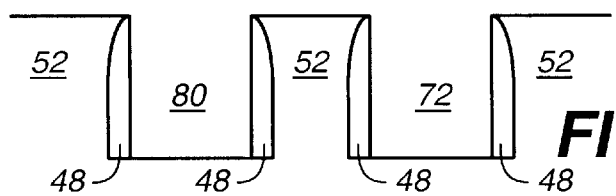
FIG._21C
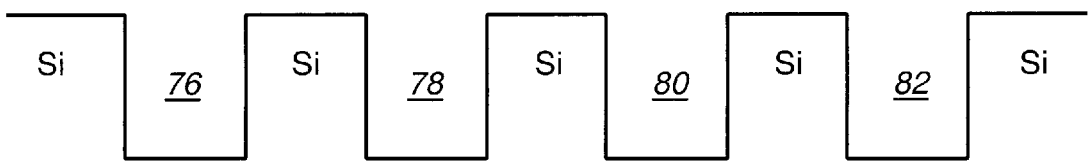
FIG._21D

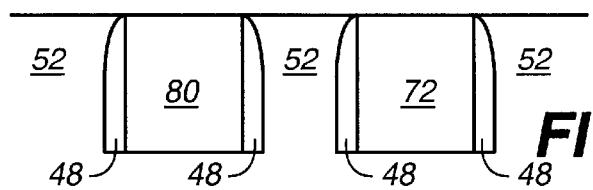
FIG._22A
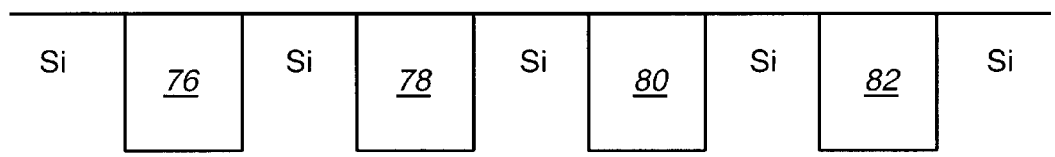
FIG._22B
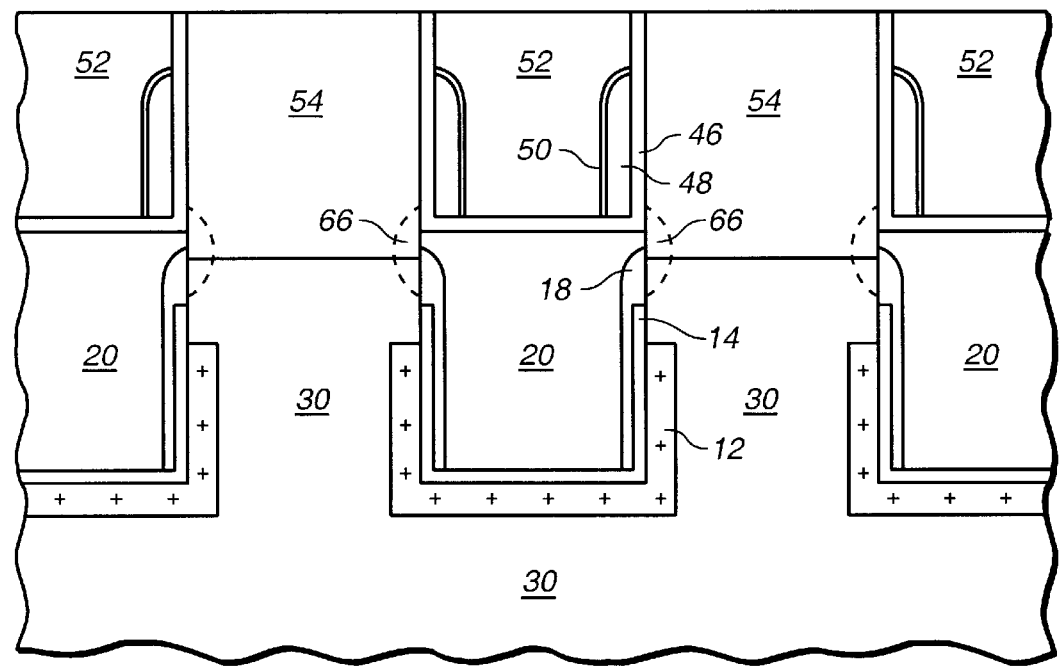
FIG._23

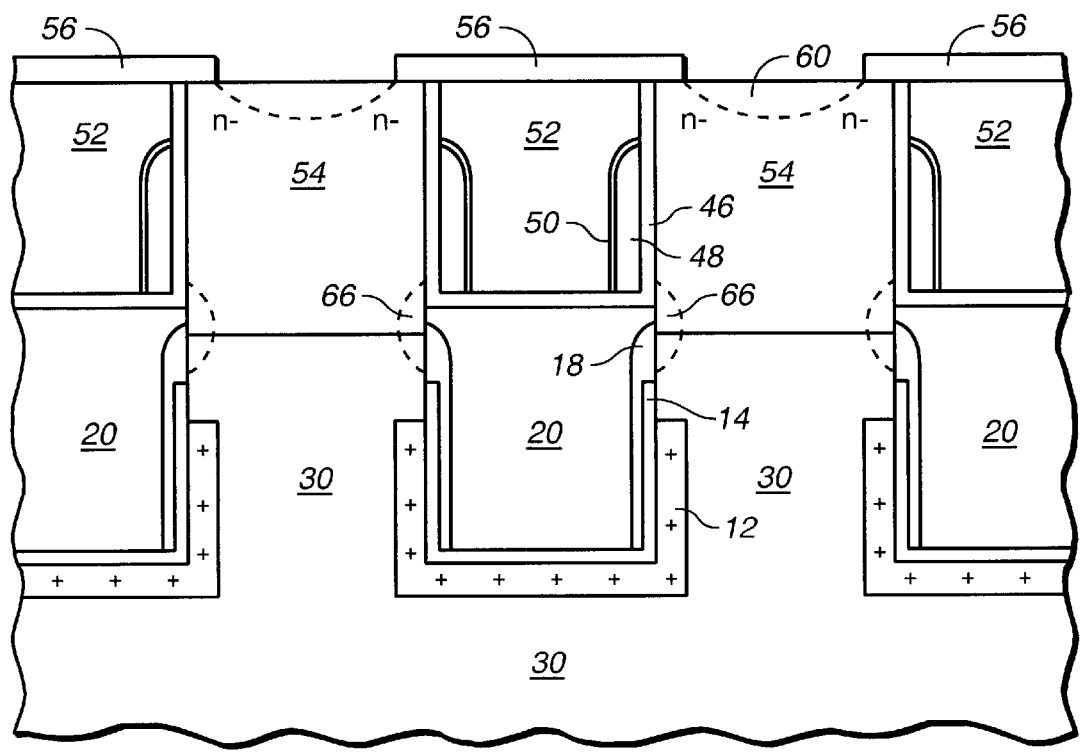
FIG._24
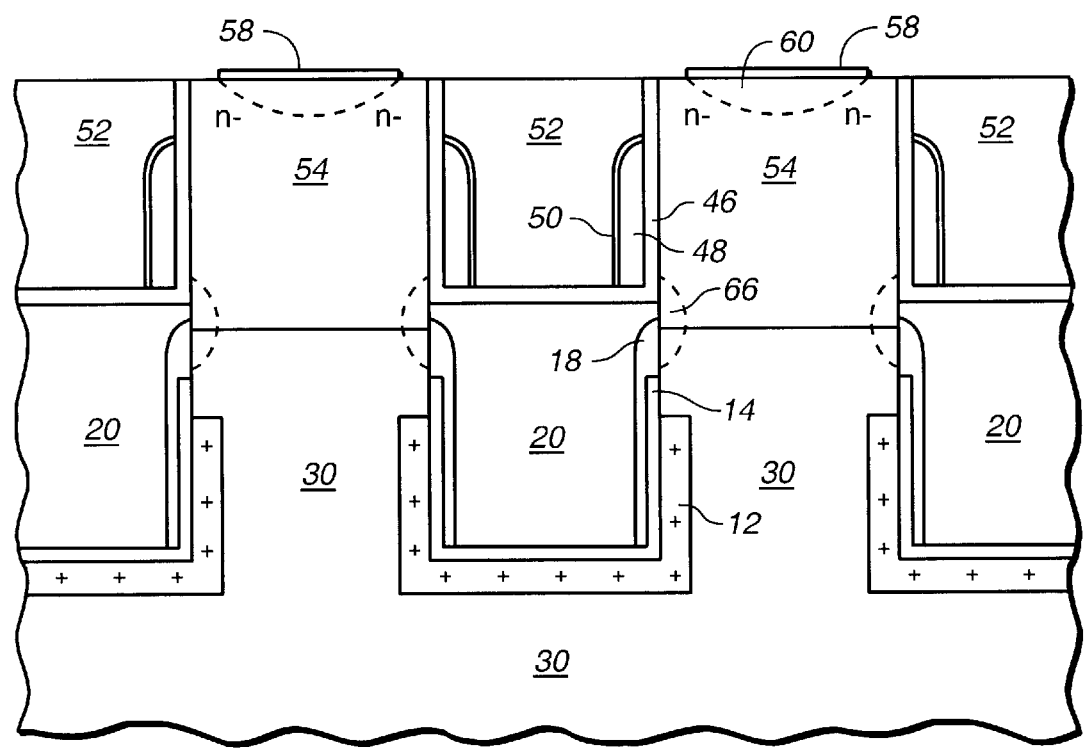
FIG._25

DRAM CELL HAVING A VERTICAL TRANSISTOR AND A CAPACITOR FORMED ON THE SIDEWALLS OF A TRENCH ISOLATION

CROSS REFERENCE TO RELATED APPLICATIONS

This is a Divisional application of prior application Ser. No. 09/083,373 filed on May 21, 1998, now U.S. Pat. No. 6,172,699.

This application is a continuation-in-part of U.S. patent application Ser. No. 09/045,633 filed Mar. 19, 1998 now U.S. Pat. No. 6,090,661, having Dung-Ching Perng and Yauh-Ching Liu as inventors, and titled FORMATION OF NOVEL DRAM CELL CAPACITORS BY INTEGRATION OF CAPACITORS WITH ISOLATION TRENCH SIDEWALLS. That application is incorporated herein by reference for all purposes.

BACKGROUND OF THE INVENTION

1. The Field of the Invention

The present invention relates to semiconductor devices and methods for their construction. More particularly, the present invention relates to capacitor design, transistor design and cell isolation methods used to reduce the surface area occupied by a DRAM cell. More specifically, the present invention merges capacitor design, transistor design and cell isolation methods by using existing isolation trench sidewalls to form a DRAM capacitor and a access transistor thus significantly increasing DRAM cell density over currently fabricated DRAM cells.

2. Background Art

Various DRAM capacitor designs have been employed to reduce the surface area occupied by a single DRAM cell. Early DRAM designs employed flat horizontal capacitor plates. Later designs, intended to conserve chip surface area, employed trenches or fin structures to form narrow dimension capacitors with some vertical contribution to the capacitor plate surface area.

In addition to the shape and size of the capacitor plates, the type of cell isolation contributes to the overall DRAM cell size. Traditionally, field oxide produced by the Local Oxidation of Silicon process (LOCOS) was used as cell isolation. Unfortunately, a field oxide must cover a fairly wide area in order to effectively isolate adjacent cells. Further, it is difficult to control the growth of field oxide. Therefore, field oxide often occupies a significant amount of the chip surface area.

More recently, trench isolation has been employed. This involves etching a narrow isolation trench around the active areas (cells) on the chip. The isolation trenches are then filled with oxide or other dielectric to effectively isolate adjacent active areas from one another. While trench isolation requires more process steps than LOCOS isolation (field oxide), trench isolation can be made much narrower than LOCOS isolation. Therefore, DRAMs employing trench isolation can be packed more densely than DRAMs employing LOCOS isolation.

In addition to isolation regions and capacitors, access transistors can also occupy a significant amount of wafer surface which limits the DRAM cell density. Typically, the gate structure and the source region of the access transistor are formed on the semiconductor substrate surface. Forming a portion of the access transistor directly above the isolation trench would significantly reduce the area of semiconductor substrate required for a DRAM cell.

In the continuing quest for higher density DRAMs, improved structures employing narrow dimension trench isolation and access transistors are still needed.

SUMMARY OF THE INVENTION

The present invention addresses this need by providing a DRAM cell where existing isolation trench sidewalls are used to form a DRAM capacitor and a portion of the access transistor is provided directly over the isolation trench sidewalls. Preferably, the access transistor is oriented vertically with respect to the plane of the integrated circuit. By integrating both the DRAM capacitor and access transistor formation with the DRAM cell isolation, the present invention may significantly increase DRAM cell density over currently fabricated DRAM cells.

In one aspect, the instant invention provides a DRAM cell including a vertically oriented pass (or access) transistor electrically coupled with a capacitor formed in an isolation trench on an active region of a semiconductor substrate. The isolation trench electrically isolates the DRAM cell from one or more adjacent DRAM cells.

The capacitor includes a first capacitor plate, a dielectric layer and a second capacitor plate. In a preferred embodiment, the first capacitor plate is defined by the semiconductor substrate at the wall of the isolation trench and has a substantially greater dopant concentration than immediately adjacent semiconductor substrate. The second capacitor plate is preferably defined by a conductive layer inside the isolation trench. The second capacitor plate occupies a portion of the isolation trench proximate to the access transistor. The conductive layer that may comprise the second capacitor plate is preferably doped polysilicon. It may be between about 200 Å and about 2000 Å thick.

The capacitor dielectric layer may be made from any suitable material that can be formed in the necessary size and shape. Suitable dielectric materials include at least one of $SiO_2$, $Si_3N_x$, silicon oxynitride, ONO ($SiO_2/Si_3N_x/SiO_2$ layered material), tantalum pentaoxide ($Ta_2O_5$), barium strontium titanate $BaSrTiO_3$ ("BST") and piezoelectric lead zirconate titanate ("PZT"). Preferably, the dielectric layer comprises a material with a high dielectric constant (e.g., at least about 10) such as BST, PZT, or $Ta_2O_5$. In one specific embodiment, the dielectric layer is $Ta_2O_5$ and is between about 20 and about 200 Å thick depending on the capacitor plate area.

The access transistor is preferably an MOS device that may have a drain electrically connected to the second capacitor plate and electrically isolated from the first capacitor plate. Preferably, the gate structure of the access transistor is provided over the capacitor in the trench isolation sidewalls and is vertically oriented with respect to the surface of the semiconductor substrate.

In the case of an MOS access transistor, the access transistor includes a semiconductor bulk section, a gate dielectric provided on a vertical sidewall of the semiconductor bulk region, a gate electrode formed on the gate dielectric, and a source region. The bulk semiconductor section is typically provided by a layer of epitaxial silicon which is deposited over the semiconductor substrate at locations outside the trench isolation. Silicide layers may optionally be provided on the gate electrode and source region. The electrical connection between the second capacitor plate and the drain of the access transistor is preferably provided as a high dopant concentration region in the semiconductor substrate and the epitaxial silicon layer.

In one embodiment, the isolation trench has a depth of at least about 0.3 µm. In another embodiment, the isolation trench has a width of at most about 0.5 μm. Preferably, the isolation trench is at least partially filled with a first dielectric material (e.g., silicon oxide). Typically, a second isolation dielectric (also silicon oxide in many cases) is provided over the first isolation dielectric material. In a specific embodiment, the gate structure of the access transistor is oriented parallel to the vertical sidewalls of the isolation trench and perpendicular to the semiconductor substrate.

In another aspect, the invention provides a method for forming a capacitor in an isolation trench and at least a portion of a vertically oriented access transistor in the area above the isolation trench in a integrated circuit. The process is characterized by forming an isolation trench about an active region in a semiconductor substrate, forming a capacitor in the isolation trench, filling the trench with a first isolation dielectric and forming at least a portion of the access transistor in the area above the isolation trench.

In one embodiment, the isolation trench includes both a capacitor dielectric and an isolation trench dielectric which occupy different areas of the isolation trench. This does not preclude embodiments where the isolation dielectric and the capacitor dielectric are made from the same material although one will generally want an isolation dielectric with a relatively low dielectric constant and a capacitor dielectric with a relatively high dielectric constant.

The capacitor may be formed by a process that may be characterized as having the following sequence: (a) forming a first capacitor plate in the semiconductor substrate immediately adjacent the sidewalls of the isolation trench; (b) forming a capacitor dielectric layer on part of the sidewalls of the isolation trench; and (c) forming a second capacitor plate on a part of the capacitor dielectric.

The first capacitor plate may be formed by a process where a dopant source material is provided on a portion of the isolation trench sidewalls. This material furnishes dopant atoms which are driven into the adjacent semiconductor substrate. The dopant source material may be conformally deposited on the trench sidewalls and then selectively removed from the top portion of the isolation trench. The location of the remaining dopant source material defines the location of the first capacitor plate.

The dopant source material may be removed from the top of the vertical sidewalls of the isolation trench by a process that may be characterized as having the following sequence: (a) depositing photoresist in the isolation trench; (b) exposing the photoresist to a specific depth in the isolation trench; (c) developing the photoresist (to remove the exposed upper part of the photoresist); and (d) removing the dopant source material from the top portion of the vertical sidewalls of the isolation trench. The process may subsequently strip or otherwise remove the photoresist from the isolation trench. Then an oxide may be deposited to cap the dopant source material and prevent diffusion at the top portion of the trench. Ultimately, the device is annealed to drive dopant from the source material into the adjacent substrate, thereby forming the first capacitor plate. Thereafter, the source material is removed from the trench.

The capacitor dielectric may be provided by a process similar to that used to provide the dopant source material. Specifically, the capacitor dielectric may be conformally deposited and then selectively removed from the top portion of the vertical sidewalls of the isolation trench.

The second capacitor plate may be provided by a process including the following sequence: (a) conformally depositing a conducting layer such as polysilicon or titanium nitride (or platinum in the case of BST dielectric) in a portion of the isolation trench; (b) an anisotropic etch that preferentially removes polysilicon from the bottom surface of the isolation trench while retaining polysilicon at the vertical sidewall of the isolation trench to form the second capacitor plate.

The access transistor may be provided by a process including the following sequence: (a) forming a gate dielectric layer; (b) forming a gate electrode over the gate dielectric layer; (c) forming a bulk semiconductor section having a vertical surface contacting the gate dielectric layer; and (d) forming a source region in the bulk semiconductor section.

The gate dielectric layer may be formed by a process including: (a) blanket depositing a support layer (preferably, though not necessarily, silicon oxide); (b) patterning the support layer to provide the support layer over the active region of the semiconductor substrate; and (c) blanket depositing a gate dielectric so that it is provided on vertical sidewalls of the support layer that are substantially parallel and adjacent to the vertical sidewalls of the isolation trench.

The support layer should be made from a material that can serve as a temporally support. Thus, it should be made from a material that can be subsequently etched away after its support function is complete. Silicon oxide is one suitable support material (it can be removed by a hydrofluoric acid wet etch). An example of another suitable support material is spin on glass (SOG). Preferably, the support layer is between about 0.05 micrometer and about 2 micrometers thick to provide support for a gate dielectric of length adequate for the access transistor. The gate dielectric may be made from oxynitride, nitride or other material resistant to etch conditions employed to etch oxide. Nitride is a preferred material when the support is made from oxide because nitride has a relatively low dielectric constant and resists etch with hydrofluoric acid. The gate dielectric layer is preferably between about 25 angstroms and about 150 angstroms thick.

The gate electrode may be formed by a process including: (a) depositing a polysilicon layer over the gate dielectric; (b) patterning the polysilicon layer to form the gate electrode.

The bulk semiconductor section may be formed by a process characterized by the following sequence: (a) filling the area above the isolation trench and adjacent to the support layer with a second support layer; (b) removing the support layer; and (c) growing an epitaxial silicon layer over the semiconductor substrate to form the bulk semiconductor section. The second support layer should resist the etching conditions employed to remove the original support layer. Thus, if the original support layer is made from oxide, the second support layer is preferably made from nitride or oxynitride. Preferably, the epitaxial silicon layer is grown to a thickness of between about 500 angstroms and about 2 micrometers.

These and other features and advantages of the present invention will be further described in the following detailed description of the invention with reference to the associated drawings.

BRIEF DESCRIPTION OF THE DRAWINGS

The invention will be further illustrated by reference to the following drawings in which:

FIG. 1A is a cross sectional view of a multi-cell DRAM structure that illustrates a two-cell trench isolation structure.

FIG. 1B is a top view of the multi-cell DRAM structure illustrated in FIG. 1A which shows a word line and bit line contact layout.

FIG. 2 is a cross sectional view of the isolation trench sidewalls of a partially fabricated DRAM device after trench isolation etch.

FIG. 3 is a cross sectional view of the isolation trench sidewalls of a partially fabricated DRAM device after deposition of a doped glass layer acting as a dopant source.

FIG. 4 is a cross sectional view of the isolation trench sidewalls of a partially fabricated DRAM device after photoresist deposition, blanket photoresist exposure and development.

FIG. 5 is a cross sectional view of the isolation trench sidewalls of a partially fabricated DRAM device after etching of the dopant source layer and photoresist removal.

FIG. 6 is a cross sectional view of the isolation trench sidewalls of a partially fabricated DRAM device after oxide deposition and annealing to drive dopant from the source layer into the trench sidewalls.

FIG. 7 is a cross sectional view of the isolation trench sidewalls of a partially fabricated DRAM device after etching to remove oxide and dopant source layers followed by node dielectric deposition.

FIG. 8 is a cross sectional view of the isolation trench sidewalls of a partially fabricated DRAM device after photoresist deposition.

FIG. 9 is a cross sectional view of the isolation trench sidewalls of a partially fabricated DRAM device after photoresist exposure and development to leave only a lower portion of the trench filled with photoresist.

FIG. 10 is a cross sectional view of the isolation trench sidewalls of a partially fabricated DRAM device after node dielectric etch to the level of the photoresist in the trench.

FIG. 11 is a cross sectional view of the isolation trench sidewalls of a partially fabricated DRAM device after photoresist removal.

FIG. 12 is a cross sectional view of the isolation trench sidewalls of a partially fabricated DRAM device after a layer of doped polysilicon has been conformally deposited for purposes of forming capacitor plates.

FIG. 13A is a top view illustrating a mask layout for anisotropic etching to remove regions of the conformally deposited doped polysilicon and showing a "vertical" cross section line (rotated 90 degrees with respect to the cell axis in FIG. 1B).

FIG. 13B is a cross sectional view through the "vertical" cross section line of FIG. 13A showing isolation trench sidewalls of a partially fabricated DRAM device after masking and etching to remove regions of doped polysilicon.

FIG. 14A is a top view showing the structure of FIG. 13A after masking, isotropic etch of doped polysilicon to define capacitor plates, and mask removal, and showing a "horizontal" cross section line.

FIG. 14B is a cross sectional view through the "horizontal" cross section line of FIG. 14A showing the isolation trench sidewalls of a partially fabricated DRAM device after masking, isotropic etch of doped polysilicon, mask removal, and trench poly spacer etch.

FIG. 15 is a cross sectional view of the isolation trench sidewalls of a partially fabricated DRAM device after trench isolation oxide deposition, CMP, and hard mask removal.

FIG. 16 is a cross sectional view of a partially fabricated DRAM device after blanket oxide deposition for providing a support for subsequently formed access transistors.

FIG. 17A is a top view of a multi-cell DRAM structure that illustrates the mask strip used to pattern oxide layer 44.

FIG. 17B is a cross sectional view of a partially fabricated DRAM device along the cross section line illustrated in FIG. 17A after masking, patterning, oxide etch and mask removal.

FIG. 18 is a cross sectional view of a partially fabricated DRAM device after gate dielectric deposition, doped polysilicon deposition, poly spacer etch and silicide formation.

FIG. 19A is a top view of a multi-cell DRAM structure that illustrates the alternating arrangement of nitride and oxide bands after nitride deposition and planarization by CMP for example.

FIG. 19B is a cross sectional view of a partially fabricated DRAM device after nitride deposition and planarization.

FIG. 20 is a cross sectional view of a partially fabricated DRAM device after oxide removal.

FIG. 21A is a top view that illustrates cross section lines a, b and c shown in FIGS. 21B, 21C and 21D respectively after selective epitaxial silicon growth.

FIG. 21B is a cross sectional view of a partially fabricated DRAM device in cross section line "a" of FIG. 21A after selective epitaxial silicon growth.

FIG. 21C is a cross sectional view of a multi-cell DRAM structure in cross section line "b" of FIG. 21A after selective epitaxial silicon growth.

FIG. 21D is a cross sectional view of a multi-cell DRAM structure in cross section line "c" of FIG. 21A after selective epitaxial silicon growth.

FIG. 22A is a cross sectional view of a multi-cell DRAM structure in cross section line "b" of FIG. 21A after oxide deposition and CMP.

FIG. 22B is a cross sectional view of a multi-cell DRAM structure in cross section line "c" of FIG. 21A after oxide deposition and CMP.

FIG. 23 is a cross sectional view of a partially fabricated DRAM devices after annealing to form drain regions for the access transistors.

FIG. 24 is a cross sectional view of a partially fabricated DRAM device after mask deposition, photomasking, patterning, hard mask etching to expose common source regions, and photomask removal.

FIG. 25 is a cross sectional view of a partially fabricated DRAM device after silicide formation on the exposed common source regions.

DETAILED DESCRIPTION OF THE PREFERRED EMBODIMENTS

A preferred embodiment of the present invention is now described with reference to FIGS. 1–25 where like reference numbers indicate identical or functionally similar elements. FIGS. 1A and 1B illustrate cross sectional and top views, respectively, of a multi-cell layout in the DRAM structure of the instant invention. FIGS. 2–7 illustrate formation of one capacitor plate in the semiconductor substrate that is parallel and adjacent to the vertical sidewalls of an isolation trench. FIGS. 8–15 depict completion of the capacitor by dielectric deposition and formation of the second capacitor plate on the vertical sidewalls of the isolation trench. FIG. 16–25 show formation of a vertical access transistor located above the trench sidewall capacitors.

While the invention will be described in conjunction with a preferred embodiment, it will be understood that it is not intended to limit the invention to one preferred embodiment. To the contrary, it is intended to cover alternatives, modifications, and equivalents as may be included within the spirit and scope of the invention as defined by the appended claims.

FIG. 1A is a cross sectional view of a multi-cell DRAM structure illustrating one complete "two-cell trench isolation structure" flanked by two other two-cell trench isolation structures (each partially shown). There are a total of four DRAM cells (1, 3, 5, and 7) shown in the figure. Note that the two-cell trench isolation structures in this layout are delineated by trench isolation regions. The four different DRAM cells 1, 3, 5, 7 are associated with four different trench sidewall capacitors 23, 25, 27 and 29 and four different vertical access transistors 93, 95, 97 and 99 respectively. Capacitors 23 and 25 are located in the sidewalls of a trench 101 while capacitors 27 and 29 are located in the sidewalls of a trench 103. Trench dielectrics are filled with a trench dielectric 85.

Access transistors 93, 95, 97 and 99 are located directly above sidewall capacitors 23, 25, 27 and 29 respectively. DRAM cells 3 and 5, having trench sidewall capacitors 25 and 27 and vertical access transistors 95 and 97, respectively, comprise a complete two-cell trench isolation structure. Both DRAM cells 1 and 7, having trench sidewall capacitors 23 and 29 and vertical access transistors 93 and 99, respectively, individually comprise one half of a two-cell trench isolation structure. For simplicity in the illustration, the second cells of those structures are not shown.

Cell 3 has a vertical access transistor 95, located above capacitor 25, that includes a source region 61, a polysilicon gate electrode 63a, a gate dielectric 65a and a drain 67a. Source 61 and drain 67a will be doped regions of common conductivity type (e.g., both are n type) in a semiconductor substrate. Cell 5 similarly includes a vertical access transistor 97 including source region 61, a polysilicon gate electrode 63b, a gate dielectric 65b, and a drain 67b. Note that transistors 95 and 97 share source 61. A bit line contact (not shown) connects to source 61. Cells 1 and 7 have similarly configured vertical access transistors 93 and 99.

Capacitor 25 includes a first plate 69a, a capacitor dielectric layer 71 a, and a second plate 73a. First plate 69a is a doped region in the semiconductor substrate adjacent a portion of a sidewall of trench 101. Its conductivity type is opposite that of the source and drain regions (e.g., it is a p+ region when source 61 and drain 67a are n type). Thus, it is electrically isolated from transistor 95. Dielectric layer 71 a covers a sidewall of trench 101 adjacent to first plate 69a. It may (but need not) extend continuously across the bottom of trench 101 and up another sidewall of the trench to serve as the dielectric layer of capacitor 23. The capacitor dielectric layer may be made from any compatible dielectric material such as silicon oxide, silicon nitride, silicon oxynitride, silicon oxide/silicon nitride/silicon oxide layered material, tantalum oxide, BST, and PZT. Preferably, the dielectric layer is formed of a material having a relatively high dielectric constant of at least about 10. Second capacitor plate 73a contacts dielectric 71a but is conductively isolated from first plate 69a and capacitor 23. It is, however, conductively coupled to drain 67a. Preferably plate 73a is formed from a doped polysilicon layer.

Capacitor 27 is similarly configured to include a first capacitor plate 69b (a doped region of the substrate abutting a sidewall of trench 103), a dielectric layer 71b, and a second capacitor plate 73b. Capacitors 23 and 29 are similarly configured but not specifically detailed by reference numbers in order to simplify the illustration.

FIG. 1B is a top view of the multi-cell DRAM structure illustrated in FIG. 1A which shows the word line and bit line contact layout. FIG. 1B shows multiple rows and columns of DRAM cells and thus illustrates more DRAM cells than are depicted in FIG. 1A. For the sake of simplicity, the trench sidewall capacitors associated with the vertical access transistors are not shown in this drawing. That is, only the access transistors are shown. The storage plates of these capacitors are parallel with (and coextensive with from the top view) the gate electrodes of the access transistors.

Word lines 39, 41, 43, 45,47, and 49 are conductive vertical strips spanning a column of cells and including the gate electrodes of the DRAM cells that they control. For example, word line 41 includes gate electrode 63a of cell 3 and word line 43 includes gate electrode 63b of cell 5. Bit lines 62 and 64 connect to multiple source regions, each shared by the access transistors of two adjacent DRAM cells. For example, bit line 64 is shown connected to common source region 61 shared by cells 3 and 5.

The region between cells 1 and 3 and between cells 5 and 7 is a trench isolation. In general, the regions between word lines 39 and 41, between word lines 43 and 45, and between word lines 47 and 49 is trench isolation. The regions between word lines 41 and 43, and between word lines 45 and 47 constitutes semiconductor bulk (on the top of which is shared source regions).

The parameter "F" is the minimum feature size attainable by a process employed to fabricate a memory device containing the DRAM cells of this invention (e.g., F defines both the minimum isolation trench widths and the minimum silicon source region widths attainable with the process under consideration). As depicted in FIG. 1B, the area required by any particular cell in the array is $2F^2$. This can be understood by considering DRAM cells 3 and 5 located on word lines 41 and 43. Together these cells occupy all of shared source region 61 share surrounding trench isolation regions with adjacent cells. In the horizontal direction (parallel to the bit lines), cells 3 and 5 require (a) the width of source region 61 (1F) together with (b) one-half the distance between word lines 43 and 45 (½F), and (c) one-half the distance between word lines 41 and 39 (½F). Thus, they occupy 2F total distance in the bit line direction. Note that the regions between word lines 43 and 45 and between word lines 41 and 39 represents trench isolation that is shared with adjacent cells 7 and 1, respectively. So only ½ the trench isolation width is attributed to cells 3 and 5. Note also that the word lines do not add to the total width because they are formed as vertical structures in the trench isolation regions.

In the direction parallel to the word lines (shown as vertical in FIG. 1B), cells 3 and 5 together occupy (a) the entire height of shared source region 61 together with (b) one-half the distance between bit lines 64 and 62 (½F), and (c) one-half the distance between word lines 64 and the next bit line below (½F). Thus, they occupy 2F total distance in the word line direction. The total area occupied by cells 3 and 5 (as well as any other two adjacent cells sharing a source region) is $4F^2$. Each cell therefore occupies $2F^2$, which is a substantial improvement over the 8–9 $F^2$ available through conventional DRAM technology. Thus, the instant invention provides trench isolation DRAM cells which require significantly less wafer surface area than DRAM cells made using existing technology.

The above DRAM devices may be formed by any suitable process. In general, the process will include steps of forming isolation trenches, forming capacitors in those trenches, and forming access transistors for accessing the isolation trench capacitors. One process for fabricating a trench isolation type DRAM device of the instant invention will now be described, referring initially to FIG. 2. The process begins with a semiconductor substrate 30 (e.g., a single crystal silicon wafer) patterned via a hard mask 2 to define an array of silicon islands and surrounding trench lattice work as depicted in FIGS. 1A and 1B. In other words, the array layout includes a repeating array of rectangular mesa-like structures (each 1F by 1F, vertical to horizontal) delineated by a continuous trench latticework.

The structure depicted in FIG. 2 is a cross sectional view through substrate 30 that illustrates the isolation trench sidewalls of a partially fabricated DRAM device after trench isolation etch. In general, each of FIGS. 2–12 represent a trench/silicon island cross section viewed through either a horizontal or vertical cut in the structure viewed from above in FIG. 1B.

The process employed to form the structure in FIG. 2, involves depositing a hard mask 2 on semiconductor substrate 30 which is preferably a uniformly lightly p doped single crystal silicon wafer. Alternatively, semiconductor substrate 30 can be a lightly n doped single crystal silicon wafer and/or include regions of nonuniform doping and may even include an epitaxial layer.

A trench 4 is formed using conventional process steps such as dry etching. Layer 2 is first patterned by a mask to define an exposed region above incipient isolation trench 4. In general, a patterned mask will include regions containing an etchant resistant material that protects the semiconductor substrate during the subsequent etch and exposed regions at locations above the incipient isolation trenches. The patterning process may be performed by photolithography or other well known methods. Preferably, a plasma etch employing $NF_3/O_2$ chemistry in a TCP 9400 reactor, available from Lam Research Corporation of Fremont, Calif., is used to form isolation trench 4. Alternatively, reactors, available from Applied Materials Corporation of Santa Clara, Calif. or other suitable semiconductor reactor sources, that use conventional silicon etch conditions, can be used to etch semiconductor substrate 30 to form isolation trench 4.

Preferably, isolation trench 4 has a depth of between about 0.1 $\mu$m and about 10 $\mu$m (more preferably a depth of at least about 0.3 $\mu$m) and a width of between about 0.1 $\mu$m and about 2.0 $\mu$m (more preferably a width of at most about 0.5 $\mu$m). In a specific embodiment employing a tantalum pentaoxide dielectric layer, the dielectric layer has a height of about 0.66 $\mu$m and a width of about 0.25 $\mu$m . Obviously, these dimensions can vary depending upon the process technology employed and trench widths can be expected to decrease in future generations.

Hard mask layer 2 is preferably left on the wafer surface after etching to protect semiconductor substrate 30 from degradation during subsequent process steps used to form isolation trench sidewall capacitors and complete device fabrication. Preferably, mask layer 2 will be silicon nitride. Alternatively, mask layer 2 can be silicon oxide, alternating layers of silicon oxide and nitride or other suitable materials.

FIG. 3 is a cross sectional view of the isolation trench sidewalls of a partially fabricated DRAM device after deposition of a dopant source layer 6. Dopant source layer 6 is used as a source of dopant atoms for subsequent diffusion into the adjacent substrate. It may contain any suitable n or p type dopant such as, for example, boron, phosphorus and arsenic. Preferably, glass ($SiO_2$) heavily doped with up to about $1\times10^{22}$ atoms/$cm^3$ boron is conformally deposited to form layer 6. Alternatively, arsenic or phosphorus doped oxide or any other suitable doped material can be used to form layer 6.

Typically, the thickness of dopant source layer 6 depends on the dopant concentration in the deposited material, the mobility of dopant atoms in the layer, etc. Thus, greater amounts of lightly doped materials must be deposited than when heavily doped materials are used to form layer 6. In one specific embodiment, layer 6 is a glass having an boron concentration of between about $1\times10^{18}$ and $1\times10^{22}$ atoms/$cm^3$ and a thickness of between about 100 Å and about 2000 Å. Most preferably, layer 6 is between about 150 Å and about 250 Å thick with a concentration of about $3\times10^{19}$ atoms/$cm^3$.

FIG. 4 is a cross sectional view of the isolation trench sidewalls of a partially fabricated DRAM device after blanket photoresist deposition, blanket photoresist exposure and development. A photoresist 8 is blanket deposited under conventional conditions on layer 6 and fills isolation trench 4. Subsequently, the photoresist is exposed and developed so that photoresist 8 only partially fills isolation trench 4 as shown. Careful control of the depth of focus and dose of blanket photoresist exposure determines the amount of resist removed during the process step. The height of photoresist remaining in the trench is a function of the composition and initial thickness of photoresist, the depth of focus and the exposure energy. These last two parameters are controlled by the optics of the system.

Alternatively, a selective plasma etch back of deposited photoresist can provide recessed photoresist 8. Here, the photoresist material, etch conditions, and length of time the photoresist is exposed to the etch conditions control the amount of photoresist removed. In one embodiment, the etch back step is a dry etch employing an oxygen chemistry.

Significantly, photoresist outside of isolation trench 4 has been removed and the height of photoresist layer 8 in isolation trench 4 is below the level of layer 2. Photoresist layer 8 protects immediately adjacent doped layer 6 on the sidewalls of isolation trench 4 during the next process step, thus allowing for selective removal of any doped layer 6 at the top of sidewalls of isolation trench 4 and over layer 2. After photoresist development, in one specific example, the photoresist fills about ⅔ of trench 4.

FIG. 5 is a cross sectional view of the isolation trench sidewalls of a partially fabricated DRAM device after etching of the doped layer and photoresist removal. Wet etch using dilute HF (e.g. about a 100 to 1 dilution of aqueous HF), for example, removes any doped layer 6 that is not covered by photoresist 8 in isolation trench 4 while leaving hard mask 2 and silicon substrate 30 unaffected. Then, photoresist 8 is stripped or otherwise removed, using well known methods, to leave doped layer 6 selectively located on the sidewalls of isolation trench 4. The height of doped layer 6 on the vertical sidewalls of isolation trench 4 is substantially similar to the height of photoresist layer 8 in FIG. 4. Thus, controlling the vertical height of photoresist in isolation trench 4 through blanket photo-exposure determines the eventual vertical height of doped layer 6 in isolation trench 4.

FIG. 6 is a cross sectional view through the isolation trench sidewalls of a partially fabricated DRAM device after oxide deposition and annealing. After photoresist 8 has been removed, an oxide layer 10 is conformally deposited in trench 4 and over hard mask 2 using conventional conformal deposition methods. Preferably, oxide layer 10 is between about 200 Å and about 1000 Å thick. Most preferably, oxide layer 10 is between about 400 Åand about 600 Å thick.

The function of oxide layer 10 is to prevent any outdiffusion from doped source layer 6 during subsequent annealing. Oxide layer 10 ensures that dopant in doped layer 6 selectively diffuses into silicon substrate 30, thus protecting the partially fabricated DRAM device from dopant contamination during subsequent dopant drive in and annealing.

Dopant drive in is preferably accomplished using a rapid thermal process at about 1000° C. for between about 30 seconds and about 5 minutes. Then, annealing at between about 900° C. and about 1100° C. (more preferably at about 1050° C.) for between about 10 minutes to about 40 minutes provides region 12 which functions as a capacitor plate of a trench isolation sidewall capacitor. Typically, the annealing time depends on the thickness and the dopant concentration of layer 6. Substrate plate 12 is comprised of heavily doped semiconductor substrate that contains substantially greater dopant concentration than immediately adjacent semiconductor substrate 30. At a minimum, the plate dopant concentration should be greater the substrate dopant concentration. In one preferred embodiment, the surface dopant concentration in plate 12 is at least about $5 \times 10^{27}$ atoms/cm$^3$. Preferably, the diffusion depth of plate region 12 is about 0.05 $\mu$m to about 0.3 $\mu$m; more preferably about 0.1 $\mu$m to about 0.15 $\mu$M. Importantly, substrate plate 12 is located next to dopant source layer 6. Thus, the height of dopant source layer 6 controls the height of capacitor plate region 12 in semiconductor substrate 30.

FIG. 7 is a cross sectional view through the isolation trench sidewalls of a partially fabricated DRAM device after removal of both oxide and dopant source layers followed by node dielectric deposition. Wet etch with dilute HF, for example, simultaneously removes oxide layer 10 and doped glass region 6 while leaving semiconductor substrate 30, mask region 2 and substrate plate 12 in tact.

A node dielectric layer 14 is conformally deposited using a suitable deposition process such as chemical vapor deposition (CVD) or physical vapor deposition (PVD). Preferably, tantalum pentaoxide ($Ta_2O_5$) is used to form layer 14. Alternatively, silicon oxide ($SiO_2$), silicon nitride ($Si_3N_x$), silicon oxide/silicon nitride/silicon oxide sandwich structure (ONO), BST, PZT or other suitable dielectric materials can be used to provide layer 14. The thickness of layer 14 depends upon, inter alia, the dielectric constant of the material in the layer, the surface area occupied by the capacitor plates, etc. Preferably, node dielectric layer 14 is between about 30 Å and about 200 Å thick. Most preferably, node dielectric layer 14 is between about 40 Å and about 100 Å thick.

A conventional requirement for a DRAM capacitor is a capacitance of about 25 femtofarads. Thus, the required trench depth of an isolation trench sidewall capacitor is directly related to the dielectric constant ($\epsilon$) of the node dielectric material. For example, when the design rule specifies a critical dimension (minimum critical feature) of about 0.25 $\mu$m using tantalum pentaoxide as dielectric ($\epsilon$=22) requires a capacitor height of about 0.66 $\mu$m, if the required capacitance of the trench sidewall capacitor is 25 femtofarads.

Increasing the dielectric constant of the node dielectric reduces the required trench depth needed for an isolation trench sidewall capacitor. Thus, using materials such as BST and PZT that have extremely large dielectric constants can substantially reduce the required trench depth of an isolation trench sidewall capacitor of a capacitance of about 25 femtofarads.

FIG. 8 is a cross sectional view of the isolation trench sidewalls of a partially fabricated DRAM device after photoresist deposition. Photoresist 16 may be deposited using conventional methods over node dielectric layer 14 and fills isolation trench 4. In FIG. 9, the photoresist has been exposed and developed. As previously mentioned careful control of the depth of focus and dose of blanket photoresist exposure determines the amount of resist removed during the process. After normal development photoresist 16 partially fills isolation trench 4.

Alternatively, conventional plasma etch back of deposited photoresist can provide recessed photoresist 16. Here, the amount of time the photoresist is exposed to the etch conditions controls the amount of photoresist removed.

After any photoresist outside of isolation trench 4 has been removed, the height of photoresist layer 16 in isolation trench 4 is below the level of the hard mask 2. The height of photoresist layer 16 inside isolation trench 4 should be higher than the vertical height as substrate capacitor plate 12 outside of isolation trench 4. Photoresist layer 16 protects immediately adjacent node dielectric 14 on the sidewalls of isolation trench 4 during the next process step, thus allowing for selective removal of any node dielectric 14 at the top of sidewalls of isolation trench 4 and over hard mask 2.

FIG. 10 is a cross sectional view of the isolation trench sidewalls of a partially fabricated DRAM device after node dielectric etch. Etching removes node dielectric 14 located at the top of the sidewalls of isolation trench 4 and over hard mask 2. However, node dielectric layer 14 immediately adjacent to photoresist 16 in isolation trench 4 unaffected by the etch conditions. Preferably, a wet etch is used, although a dry etch such as an sputter argon etch may be used to remove a node dielectric material such as tantalum pentaoxide.

FIG. 11 is a cross sectional view of the isolation trench sidewalls of a partially fabricated DRAM device after photoresist removal. Photoresist 16 is stripped using conventional conditions to leave node dielectric 14 adjacent to the sidewalls of isolation trench 4. The height of node dielectric 14 on the vertical sidewalls of isolation trench 4 is similar to the vertical height of photoresist layer 16 in FIG. 10. It should be higher than the vertical height of substrate plate 12. This ensures that the subsequently formed second capacitor plate does not short with substrate plate 12. Thus, controlling the vertical height of photoresist in isolation trench 4 through control of the deposition process and the blanket exposure ensures that the vertical height of node dielectric 14 in isolation trench 4 remains higher than the vertical height of the substrate plate 12 immediately adjacent to isolation trench 4.

FIG. 12 is a cross sectional view of the isolation trench sidewalls of a partially fabricated DRAM device after conformal deposition of a doped polysilicon layer 18. Preferably, doped polysilicon layer 18 is deposited to a thickness of between about 200 Å and about 1000 Å. Doped polysilicon layer 18 should be evenly and continuously distributed over node dielectric 14 to function as a second capacitor plate in a trench isolation sidewall capacitor after modification in subsequent process steps. Importantly, doped polysilicon layer 18 does not completely fill isolation trench 4 thus allowing for selective anisotropic etch in a later process step. While polysilicon is a preferred material for the second plate, other conductive materials may be used in its place.

Either n or p type dopants may be used in doped polysilicon layer 18 although, typically, the type of dopant used depends on the nature of semiconductor substrate 30. For example, when semiconductor substrate 30 is a uniformly lightly p doped single crystal silicon wafer, a n type dopant is used in doped polysilicon layer 18.

The direction through which the isolation trench cross section is viewed (i.e. along the bit lines or word lines) is irrelevant to the process steps described in FIGS. 2–12.

However, in the ensuing process step, the locations of the second capacitor plates are defined as shown in FIGS. 13A and 14A. Thus, the direction of the cross sectional view in subsequent steps determines whether a DRAM capacitor is or is not shown in the isolation trench. The isolation trench, as viewed in FIG. 13B, follows a cross section line 38 (parallel to the direction of the word lines) illustrated in FIG. 13A and therefore does not show any capacitors. However, the isolation trench illustrated in FIGS. 14B, 15 and 16 follows a cross section line 68 (across the direction of the word lines) shown in FIG. 14A and therefore shows two DRAM capacitors formed on regions of the isolation trench sidewalls.

FIG. 13A is a top view of a partially fabricated DRAM device that shows the locations of protected polysilicon that will provide the second capacitor plates.

The structure illustrated in FIGS. 13A and 13B arises after masking and etching to remove regions of doped polysilicon. Prior to these process steps, doped polysilicon covered the entire area illustrated in FIG. 13A. The mask protects horizontal strips (as shown in FIG. 13A) of along the paths of subsequently formed bit lines. It exposes horizontal strips between rows of active regions along the bit line direction. During etching of the masked structure, doped polysilicon in region 40 is removed to prevent short circuiting between capacitor plates in adjacent cells.

Stated another way, masking protects doped polysilicon regions 32 during the subsequent etching to remove doped polysilicon covering trench regions 40. The mask is first patterned to define exposed regions 40. The mask may be rectangularly shaped or take the form of linear strips, so long as regions 32 are protected and region 40 is exposed. The following assumes that the mask forms linear strips.

In general, a patterned mask will include regions containing an etchant resistant material that protects doped polysilicon regions 32 and 34 during the subsequent etch and exposes location 40. The patterning process may be performed by photolithography or other well known methods. Isotropic etch of doped polysilicon region 40, using well known conditions, provides the structure depicted in FIG. 13A after mask removal. Doped polysilicon has been removed from region 40.

FIG. 13B is a cross sectional view taken through cross section line 38 shown in FIG. 13A. FIG. 13B shows isolation trench sidewalls after masking and etching to remove regions of doped polysilicon. Importantly, an isotropic etch has removed all of doped polysilicon layer 18 from the illustrated region of trench 4. Since, doped polysilicon, which comprises a conductive layer necessary for capacitor formation, has been removed, a trench isolation sidewall capacitor cannot be formed in trench 4 on the sidewalls along region 40.

After doped polysilicon has been etched from region 40, while protecting regions 32 and 34, the remaining doped polysilicon is subjected to an anisotropic or "trench spacer" etch. FIG. 14A is a top view showing the isolation trench sidewalls after anisotropic etch of doped polysilicon. Note that cross section line 68 in FIG. 14A is oriented at an angle of 90 degrees with respect to cross section line 38 of FIG. 13A. The isotropic etch of doped polysilicon, described previously, removed all doped polysilicon in region 40 as shown in FIG. 13A. After mask removal, the doped polysilicon region 32 (and possibly region 34) in FIG. 13A is anisotropically etched to yield isolation trench sidewall capacitors. Importantly, the polysilicon structures of isolation trench sidewall capacitors are electrically isolated from other regions of doped polysilicon and can thus function as capacitor plates.

FIG. 14B is a cross sectional view taken through the cross section line shown in FIG. 14A. The isotropic etch of doped polysilicon previously mentioned removed all doped polysilicon at region 40 except the doped polysilicon covering the sidewalls and bottoms of trenches 4 when viewed along cross section line 68. However, the doped polysilicon regions covering the vertical sidewalls cannot be used as capacitor plates because they conductively connect capacitors of two adjacent cells (on opposite sides of the trench isolation). Trench poly spacer etch selectively removes doped polysilicon from the bottom surface of isolation trench 4, thus electrically isolating doped polysilicon 18 on the vertical sidewalls of isolation trench 4 to complete isolation trench sidewall capacitors formation. Electrically isolated doped polysilicon layer 18 functions as a capacitor plates in isolation trench sidewall capacitors. Any suitable polysilicon spacer etch conditions may be employed. Typically, the etch will include a significant physical etching or sputtering component to ensure a highly anisotropic etch which selectively removes doped polysilicon from the bottom of isolation trench 4.

The etch is complete when capacitor plates 18 reach a desired height and thickness. They should extend above the top of node dielectric 14 where they contact a region of substrate plate 12 above the top of substrate plate 12. In a preferred embodiment, employing arsenic doped polysilicon in a 0.25 $\mu$m trench or 0.5 $\mu$m depth, capacitor plates 18 are between about 0.02 $\mu$m and 0.1 $\mu$m thick.

The trench isolation sidewall capacitor consists of substrate plate 12, node dielectric 14 and polysilicon plate (node) 18. During normal DRAM operation, the substrate plates of the isolation trench sidewall capacitors are held at the potential of the substrate (e.g., ground or a reference voltage such as ½ Vcc). Thus, the electrical storage of a DRAM cell depends on the charge of the node in the isolation trench.

FIG. 15 is a cross sectional view of the isolation trench sidewalls of a partially fabricated DRAM device after trench isolation oxide fill, planarization and hard mask removal. Preferably, blanket deposition of oxide or other suitable dielectric material 20 using CVD fills isolation trench 4 to a level suitable to isolate adjacent devices. Typically, isolation dielectric 20 completely fills trench 4 and covers hard mask 2. In any event, a suitable planarization technique such as Chemical Mechanical Polishing (CMP) removes dielectric 20 that is above the level of hard mask 2. Subsequently, mask 2 is removed to yield bare semiconductor substrate 30. A conventional wet etch employing hot phosphoric acid, for example, may be employed to remove hard mask 2.

FIG. 16 is a cross sectional view of a partially fabricated DRAM device after blanket deposition of a dielectric material by CVD which is preferably oxide. Preferably layer 44 is between about 0.05 micrometer and about 2 micrometers thick (most preferably between about 0.13 micrometer and about 0.8 micrometer thick).

FIG. 17A is a top view of a multi-cell DRAM structure that illustrates the mask strips used to pattern layer 44. Strips 49 represent the exposed portions and strips 44 represent the protected regions of oxide. Strips 44 cover the active regions (to be formed later) and run parallel to the word lines (to be formed later). Thus, oxide 44 is patterned to form a continuous strips above the silicon mesas in the underlying structure. Oxide 44 is removed from the regions overlying trench regions 4 which contains the sidewall capacitors.

FIG. 17B is a cross sectional view of a partially fabricated DRAM device taken through the cross section line 45 shown in FIG. 17A after masking, patterning, oxide etch and mask removal. Masking and patterning are performed using conventional methods well known to those skilled in the semiconductor arts. Oxide etch is typically performed using $CF_4$, $CHF_3$ or $C_4F_8$ chemistry to leave oxide strips 44. Significantly, oxide has been removed from above trench 4 which contains the sidewall capacitors and the isolation dielectric 20. The vertical sides of oxide strips 44 are aligned with the sidewalls of the isolation trench 4 and thus comprise a contiguous extension of the trench. Oxide strips 44 provide a scaffolding structure for subsequent gate and word line formation. Since the oxide forms strips it defines a continuous word line path.

FIG. 18 is a cross sectional view of partially fabricated DRAM devices after blanket deposition of gate dielectric, doped polysilicon deposition, polysilicon spacer etch and silicide formation. It should be understood that any suitable process steps may be employed to fabricate these gate structures/word lines on the oxide scaffolding, which are typically, conventional MOS devices.

Preferably, the gate dielectric is an oxynitride or nitride layer 46 deposited using suitable conditions such as low pressure chemical vapor deposition. Note that layer 46 serves as the gate dielectric of the subsequently formed access transistor. Nitride is preferable to silicon oxide typically used in transistor fabrication because nitride is resistant to etch conditions subsequently used to remove support layer 44. Preferably, nitride layer 46 is between about 25 angstroms and about 150 angstroms thick (more preferably, between about 35 angstroms ,and about 90 angstroms thick.)

Deposition of a doped polysilicon layer over gate dielectric 46 followed by anisotropic polysilicon spacer etch leaves gate electrodes/word lines 48. These steps may be accomplished by any suitable methods such as those well known in the art. Preferably, doped polysilicon 48 is between about 200 angstroms and about 3000 angstroms thick (more preferably between about 500 angstroms and about 1500 angstroms thick).

A silicide layer 50 is formed over the gate electrode to reduce device resistance which results in a higher device switching speed. Silicide layer 50 can also serve as an etch stop when performing a contact etch. These two features of the Self Aligned Silicide (Salicide) process are important in current fabrication technology for forming 0.25 $\mu$m devices and in the emerging technology of fabricating 0.18 $\mu$m devices. Preferably, the silicide layer 50 is comprised of at least one of $CoSi_2$, $TiSi_2$, $NiSi_2$ or $WSi_2$. Preferably, silicide layers 50 are between about 200 angstroms and about 1500 angstroms thick. More preferably, layer 50 is between about 500 angstroms and about 1000 angstroms.

Thus, a gate structure comprised of gate dielectric layer 46, polysilicon layer 48 and silicide layer 50 has been formed on oxide scaffolding layer 44. The gate structure extends over the trench sidewall capacitors as is depicted in FIG. 18.

FIG. 19A is a top view of a multi-cell DRAM structure that illustrates an alternating arrangement of nitride and oxide after nitride deposition and planarization by CMP, for example. As shown, oxide layer 44 remains as strips supporting vertical word lines, while nitride 52 fills the gaps between the alternating oxide strips. The region above the trench regions 4 have been filled with nitride. Gate structures (word lines) on the oxide scaffolding are located at the interface with the strips of nitride.

FIG. 19B is a cross sectional view of a partially fabricated DRAM device after blanket nitride or oxynitride deposition and planarization by CMP, for example. Nitride may be deposited using low pressure CVD conditions and CMP removes nitride above the height of oxide layer 44. Nitride is used in this process step because it is a good gap filling material and resists etch conditions used to remove oxide. A major function of nitride layer 52 is to protect gate and word line structure and oxide layer 20 during removal of oxide 44 in die next process step.

FIG. 20 is a cross sectional view of partially fabricated DRAM devices after oxide removal using, for example, a conventional wet etch with dilute hydrofluoric acid. Nitride strips 52 now cover the area above the isolation dielectric 20 and thus support the gate structures during this process step.

FIG. 21A is a top view that illustrates the structure remaining after anisotropic epitaxial silicon growth in the regions where oxide strips 44 were removed. Direction selective epitaxial silicon growth, which is known in the art (see, H. Hada et al., *Tech Dig*. IEDM, 666, 1995), may be employed to furnish the silicon body for access transistors. The resulting silicon structure may be locally doped to form common source regions (not shown here) employed in the access transistors and for the bit line contacts.

A convenient method for selectively doping the source regions of the epitaxial silicon strips 54 is by masking and ion implantation to form regions of the necessary size and dopant concentration (performed later in the process). Alternatively, the dopant concentration in the epitaxially grown silicon can be increased near the top of the silicon structures.

Preferably, epitaxial silicon layer is grown using ultra high vacuum CVD deposition. The epitaxial silicon layer may be between about 0.05 micrometers and about 2 micrometers thick. More preferably, the epitaxial silicon layer is between about 0.13 micrometers and about 0.8 micrometers thick. Preferably, the source regions 60 of the epitaxial silicon layer has a dopant concentration of between about $10^{16}$ and $10^{19}$ atoms/$cm^3$.

Depending upon the degree of anisotropy in the epitaxial silicon growth conditions, the resulting silicon structure will grow in either anisotropic columns directly over the silicon mesas (illustrated in die structure of FIG. 13A for example) or isotropic strips 54 where oxide strips 44 previously resided as shown in FIG. 21A. The process illustrated in FIGS. 21–25, assumes that columnar silicon structures are formed.

FIG. 21B is a cross sectional view (line A of FIG. 21A) of a partially fabricated DRAM device in cross section (in a direction parallel to the bit lines and taken through the gate electrodes and capacitors) after selective anisotropic epitaxial silicon growth and source region formation. Epitaxial silicon layer 54 is anisotropically grown directly over semiconductor substrate 30 and fills the gap left by oxide etch but not on the areas that do not contain exposed silicon substrate. The epitaxial silicon 54 possesses a n-doped region at the top of the layer in this particular embodiment.

FIG. 21C is a cross sectional view (line B of FIG. 21A) of a multi-cell DRAM structure above the capacitor layer in cross sectional direction parallel to the bit lines and taken through sections outside the silicon islands after columnar anisotropic epitaxial silicon growth. Significantly, epitaxial silicon has not grown in regions 80 and 72 which are located between alternating layers of nitride. Note though that nitride strips 52 do include word lines 48.

FIG. 21D is a cross sectional view (line C of FIG. 21A) of multi-cell DRAM structure above the capacitor layer in cross sectional direction parallel to the word lines and taken through the silicon mesas 34 (see FIG. 13A) after columnar anisotropic epitaxial silicon growth. This figure illustrates the lack of epitaxial silicon growth in regions 76, 78, 80 and 82 which are over trench regions in the capacitor layer.

FIGS. 22A and 22B are cross sections of the transistor layer (and not including the capacitor layer) taken through cross section lines B and C of FIG. 21A after oxide deposition and planarization by, for example, CMP. Oxide fill gaps 72 and 80 in FIG. 22A and gaps 76, 78, 80, and 82 in FIG. 22B. This oxide gap fill process fills the voids left by removal of support layer 44 and remaining after columnar epitaxial silicon growth.

FIG. 23 is a cross sectional view of a partially fabricated DRAM device after annealing. Importantly, the drain regions 66 have been formed by outdiffusion from polysilicon plates 18 during annealing which is preferably performed at a temperature of between about 800 degrees Centrigrade and about 1100 degrees Centrigrade and for a period of between about 30 seconds and fourty minutes.

FIG. 24 is a cross sectional view of a partially fabricated DRAM device after hard mask (nitride or oxide) deposition, photomasking, patterning, nitride etching and ion implantation to form source regions 60 (assuming that these regions were not previously formed as a part of the epitaxial silicon growth step). Nitride deposition and patterning provide layer 56 which defines the locations of the common source regions 60.

FIG. 25 is a cross sectional view of a partially fabricated DRAM device after silicide formation. Silicide layer 58 is formed over the common source region located at the top of epitaxial silicon layer 54 to reduce device resistance. Preferably, the silicide layer 58 is comprised of at least one of $CoSi_2$, $TiSi_2$, $NiSi_2$ or $WSi_2$. Mask 56 is then removed.

This process step thus completes formation of the vertically oriented access transistor which is now electrically connected to the sidewall capacitor through drain regions 60.

The structure shown in FIG. 25 may be converted to a complete DRAM array by conventional processes. For example, a dielectric layer may be formed over the top surface. Subsequently, a first metallization layer is deposited and patterned to form lines (e.g., bit lines) connecting various DRAM cells. The exact layout of the lines will be determined by the particular DRAM design. The patterning is done by first depositing a mask such as a photoresist and then exposing it to light to define the pattern of metal lines to be created in a subsequent etch step. Thereafter, the underlying first metallization layer is etched by a plasma process such as reactive ion etching (RIE).

After the first metallization layer has been etched, the photoresist is removed and a dielectric layer is deposited over the first metallization layer in order to insulate the lines of this metallization layer. Typically, oxide or borophosphosilicate glass is used as the dielectric layer, but other dielectrics such as a nitride, spin on glass (SOG), or polyimide films (which can also be laid on by spinning) may also be used. The dielectric layer is then planarized by any appropriate technique.

It may be necessary to form subsequent metallization layers. If so, after the dielectric layer has been formed and planarized as described, a via mask is formed on the dielectric layer's upper surface. The via mask will define vias or regions where interconnects between the first and second metallization layers are to be formed. Thereafter, another plasma assisted etch is performed to create the actual vias in the dielectric layer. These are then filled with tungsten (which is planarized), before the next metallization layer (metal-2) is deposited and patterned as described above. In some cases, it may be necessary to form and pattern one or more additional metallization layers to complete the wiring of the DRAM.

Generally, the DRAMs of this invention can be used in any application where conventional DRAMs find use. They may be used in DRAM chips or as embedded memory in logic chips. Specific examples of embedded memory chips which can make use of the DRAM designs of this invention include printer and graphics integrated circuits.

Although the foregoing invention has been described in some detail to facilitate understanding, it will be apparent that certain changes and modifications may be practiced within the scope of the appended claims. For example, while the specification has been limited to a discussion of doped polysilicon to form a node there is in principle no reason why other conductive materials could not be used to form a node. Although isolation trench side wall capacitors have been illustrated as being particularly useful in DRAM cells that follow a design rule of 0.25 $\mu$m and have isolation trenches of a depth of at least about 0.5 $\mu$m the instant invention is not limited to DRAM cells or trenches of these dimensions Accordingly, the present embodiments are to be considered as illustrative and not restrictive, and the invention is not to be limited to the details given herein, but may be modified within the scope and equivalents of the appended claims.

What is claimed is:

1. A method for forming a capacitor and an access transistor for a DRAM cell in an integrated circuit, the method comprising:

forming an isolation trench about an active region in a semiconductor substrate;

forming a capacitor in said isolation trench;

substantially filling said isolation trench with an isolation dielectric; and forming a vertically oriented access transistor having at least a portion lying above said isolation trench.

2. The method of claim 1 wherein said isolation trench is formed to a depth of at least about 0.3 $\mu$m.

3. The method of claim 1 wherein said isolation trench is formed to a width of at most about 2 $\mu$m.

4. The method of claim 1 wherein said capacitor is formed by a process comprising:

converting a portion of the semiconductor substrate adjacent to the sidewalls of the isolation trench to a first capacitor plate;

providing a capacitor dielectric on a portion of the sidewalls of the isolation trench; and forming a second capacitor plate on said capacitor dielectric.

5. The method of claim 4 wherein said first capacitor plate is formed by a process comprising:

providing a dopant source material on a portion of the isolation trench sidewalls adjacent to said portion of the semiconductor substrate to be converted to said first capacitor plate; and driving dopant atoms from said dopant source material into the semiconductor substrate to form said first capacitor plate.

6. The method of claim 5 wherein said dopant source material is provided on the isolation trench sidewalls by a process comprising;

conformally depositing said dopant source material on the sidewalls of the isolation trench; and removing said dopant source material from at least an upper portion of the vertical sidewalls of the isolation trench.

7. The method of claim 6 wherein said dopant source material is a doped glass.

8. The method of claim 4 wherein said capacitor dielectric is formed by a process comprising:

conformally depositing said capacitor dielectric on the sidewalls of the isolation trench; and removing said capacitor dielectric from an upper portion of the vertical sidewalls of the isolation trench.

9. The method of claim 4 wherein said second capacitor plate is formed by a process comprising:

conformally depositing a doped polysilicon layer within a portion of the isolation trench; and anisotropically etching said doped polysilicon layer to preferentially remove doped polysilicon at the bottom sidewall of the isolation trench while retaining doped polysilicon at the vertical sidewalls of the isolation trench to form the second capacitor plate.

10. A method for forming a capacitor and a access transistor for a DRAM cell in an integrated circuit, the method comprising:

forming an isolation trench about an active region in a semiconductor substrate;

forming a capacitor in said isolation trench; and forming a vertically oriented access transistor having at least a portion lying above said isolation trench;

wherein said access transistor is formed by a process comprising:
forming a gate dielectric layer;
forming a gate electrode over said gate dielectric layer;
forming a bulk semiconductor section having a vertical surface contacting the gate dielectric layer; and
forming a source region in the bulk semiconductor section.

11. The method of claim 10, wherein the source region is formed on an upper surface of the bulk semiconductor which is substantially perpendicular to the vertical surface.

12. The method of claim 10, further comprising annealing to provide a drain connection between said access transistor and said capacitor.

13. The method of claim 10 wherein said gate dielectric layer is formed by a process comprising:

blanket depositing a support layer;

patterning said support layer to provide said support layer over the active region of said semiconductor substrate; and blanket depositing a gate dielectric, wherein said gate dielectric is provided on vertical sidewalls of said support layer.

14. The method of claim 13 wherein said support layer is made from a silicon oxide.

15. The method of claim 13 wherein said support layer is between about 0.05 micrometers and about 2 micrometers thick.

16. The method of claim 13 wherein said gate dielectric layer is between about 25 angstroms and about 150 angstroms thick.

17. The method of claim 13 wherein said gate dielectric includes at least one of oxynitride and nitride.

18. The method of claim 10 wherein said gate electrode is formed by a process comprising:

depositing a polysilicon layer over said gate dielectric layer; and patterning said polysilicon layer to provide said gate electrode.

19. The method of claim 13 wherein forming said bulk semiconductor section includes a process comprising:

filling the area above said isolation trench and adjacent to said support layer with a second support layer;

removing said support layer; and growing an epitaxial silicon layer over said semiconductor substrate to form said bulk semiconductor section.

20. The method of claim 19 wherein said second support layer is made from a material selected from the group comprising nitride and oxynitride.

21. The method of claim 19 wherein said epitaxial silicon layer is grown to a thickness of between 0.05 micrometers about and about 2 micrometers.

* * * * *